United States Patent
Yamada et al.

(10) Patent No.: US 7,240,410 B2
(45) Date of Patent: Jul. 10, 2007

(54) METHOD FOR MANUFACTURING A PIEZOELECTRIC RESONATOR

(75) Inventors: Hajime Yamada, Otsu (JP); Masaki Takeuchi, Otsu (JP); Hideki Kawamura, Shiga-ken (JP); Hiroyuki Fujino, Omihachiman (JP); Yukio Yoshino, Otsu (JP); Ken-ichi Uesaka, Shiga-ken (JP); Tadashi Nomura, Kyoto (JP); Daisuke Nakamura, Shiga-ken (JP); Yoshimitsu Ushimi, Omihachiman (JP); Takashi Hayashi, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 286 days.

(21) Appl. No.: 11/094,622

(22) Filed: Mar. 30, 2005

(65) Prior Publication Data

US 2005/0168110 A1 Aug. 4, 2005

Related U.S. Application Data

(62) Division of application No. 10/329,602, filed on Dec. 27, 2002, now Pat. No. 6,906,451.

(30) Foreign Application Priority Data

| Jan. 8, 2002 | (JP) | ............................. 2002-001329 |
| May 17, 2002 | (JP) | ............................. 2002-142350 |
| Nov. 19, 2002 | (JP) | ............................. 2002-335120 |
| Nov. 21, 2002 | (JP) | ............................. 2002-338036 |
| Nov. 21, 2002 | (JP) | ............................. 2002-338037 |

(51) Int. Cl.
*H04R 17/00* (2006.01)
*H01L 41/00* (2006.01)

(52) U.S. Cl. .......................... 29/25.35; 29/594; 29/830; 29/831; 29/832; 29/846; 29/847; 310/324

(58) Field of Classification Search ............... 29/25.35, 29/594, 830, 831, 832, 846, 847; 310/324, 310/311, 334, 364, 346; 216/13, 76, 77, 216/78; 204/192.18, 192.23; 427/524, 525, 427/527, 528, 537, 531

See application file for complete search history.

(56) References Cited

U.S. PATENT DOCUMENTS 4,456,850 A * 6/1984 Inoue et al. ................. 310/324

(Continued)

FOREIGN PATENT DOCUMENTS

EP 00124437 11/2000

(Continued)

OTHER PUBLICATIONS

Official Communication issued in corresponding Japanese Patent Application No. 2002-338036, dated Sep. 5, 2006.

(Continued)

*Primary Examiner*—A. Dexter Tugbang
*Assistant Examiner*—Tai Van Nguyen
(74) *Attorney, Agent, or Firm*—Keating & Bennett, LLP

(57) ABSTRACT

A piezoelectric thin film resonator having a stabilized temperature characteristic of resonant frequency, a method for manufacturing the same, and a communication apparatus using the piezoelectric thin film resonator are provided. The piezoelectric thin film resonator is provided with a substrate having an opening, first and second insulation films which are provided on one surface of the substrate while covering the opening and which primarily include $SiO_2$ and $Al_2O_3$, respectively, $Al_2O_3$ having oxygen defect and being in an amorphous state, and a piezoelectric thin film which is provided on the second insulation film and is sandwiched between electrodes and which primarily includes ZnO.

2 Claims, 28 Drawing Sheets

U.S. PATENT DOCUMENTS

| | | | |
|---|---|---|---|
| 4,719,383 A * | 1/1988 | Wang et al. ................ | 310/324 |
| 5,504,388 A | 4/1996 | Kimura et al. | |
| 5,692,279 A * | 12/1997 | Mang et al. ............... | 29/25.35 |
| 6,045,626 A * | 4/2000 | Yano et al. ................ | 148/33.4 |
| 6,515,402 B2 | 2/2003 | Klee et al. | |

FOREIGN PATENT DOCUMENTS

| | | |
|---|---|---|
| JP | 58-137317 A | 8/1983 |
| JP | 03-046504 A | 2/1991 |
| JP | 04-354411 A | 12/1992 |
| JP | 11-116387 | 4/1999 |
| JP | 2000-69594 | 3/2000 |
| JP | 2000-196404 A | 7/2000 |
| JP | 2000-244030 | 9/2000 |
| JP | 2000-278078 | 10/2000 |
| JP | 2001-274650 A | 10/2001 |
| JP | 2001-279438 A | 10/2001 |
| JP | 2001-313535 | 11/2001 |
| JP | 2001-326553 A | 11/2001 |
| JP | 2002-043646 A | 2/2002 |
| JP | 2004-221622 A | 8/2004 |

OTHER PUBLICATIONS

Official Communication issued in corresponding Japanese Patent Application No. 2002-338037, dated Sep. 5, 2006.

* cited by examiner

METHOD FOR MANUFACTURING A PIEZOELECTRIC RESONATOR

This application is a Divisional Application of U.S. patent application Ser. No. 10/329,602 filed Dec. 27, 2002, now U.S. Pat. No. 6,906,451.

BACKGROUND OF THE INVENTION

1. Field of the Invention

The present invention relates to a piezoelectric resonator, a piezoelectric filter including a piezoelectric resonator, a duplexer, a communication apparatus, and a method for manufacturing a piezoelectric resonator.

2. Description of the Related Art

A piezoelectric resonator provided with a piezoelectric thin film on a substrate has been used as a filter for a communication device.

Some piezoelectric resonators include piezoelectric vibration portions in which a piezoelectric thin film is sandwiched between opposed upper and lower electrodes, and a high-frequency signal is applied to the sandwiched piezoelectric thin film via the electrodes such that the piezoelectric thin film vibrates in a thickness vibration mode. Examples of such piezoelectric resonators include a diaphragm type piezoelectric resonator having an opening in a substrate which is covered with a diaphragm made of laminated thin films, and the piezoelectric vibration portion is supported by this diaphragm.

FIG. 42 is a sectional view showing the structure of a conventional piezoelectric resonator (see, for example, Japanese Unexamined Patent Application Publication No. 2001-279438).

This piezoelectric resonator includes a substrate 201, a plurality of substrate films 202 and 203, a pair of electrodes 204 and 206, and a piezoelectric thin film 205. Since the substrate film is defined by a plurality of layers as described above, each substrate film shares functions, for example, chemical stability and adhesiveness, and as a result, improvement of the performance and reliability of the piezoelectric resonator are achieved.

Furthermore, some piezoelectric resonators include piezoelectric vibration portions in which a piezoelectric thin film is sandwiched between opposed upper and lower electrodes, and a high-frequency signal is applied to the sandwiched piezoelectric thin film via the electrodes and, therefore, the piezoelectric thin film vibrates in a thickness vibration mode. Examples of such piezoelectric resonators include a diaphragm type piezoelectric resonator having a structure in which an opening of a substrate is covered with a diaphragm made of laminated thin films, and the piezoelectric vibration portion is supported by this diaphragm.

In some piezoelectric resonators having a diaphragm structure, the residual stress during diaphragm formation is adjusted to be nearly zero and, thereby, the resonant characteristics are improved, or the diaphragm surface is flattened with high precision and, thereby, the resonant characteristics are improved (see, for example, Japanese Unexamined Patent Application Publication No. 2000-244030).

Japanese Unexamined Patent Application Publication No. 2001-279438 discloses an example of a piezoelectric resonator in which the lower substrate film 202 of a plurality of substrate films is made of SiNx, the upper substrate film is made of $Al_2O_3$, and the piezoelectric thin film is made of ZnO.

However, regarding the configuration of such a conventional piezoelectric resonator, since each of the temperature coefficient of resonant frequencies (TCF) of SiNx, $Al_2O_3$, and ZnO has a negative value, when the substrate films 202 and 203 made of SiNx and $Al_2O_3$ are combined with the piezoelectric thin film 205, the temperature coefficient of resonant frequency in the basic mode is deteriorated.

Furthermore, regarding the piezoelectric resonator in which the residual stress during diaphragm formation is adjusted to be nearly zero, when the diaphragm surface is not flat, the crystallinity and orientation property of the piezoelectric vibration portion are reduced and, therefore, the resonant characteristics cannot be sufficiently improved. Regarding the piezoelectric resonator in which the diaphragm surface is flattened, when the stress remains, the resonant characteristics cannot be sufficiently improved.

SUMMARY OF THE INVENTION

In order to overcome the problems described above, preferred embodiments of the present invention provide a piezoelectric resonator having a stabilized temperature characteristic of resonant frequency, a method for manufacturing such a novel piezoelectric resonator, a piezoelectric filter including the novel piezoelectric resonator, a duplexer, and a communication apparatus.

Furthermore, preferred embodiments of the present invention provide a piezoelectric resonator having reduced residual stress in a diaphragm and improved flatness of the diaphragm surface and, therefore, having outstanding resonant characteristics.

A piezoelectric resonator according to a preferred embodiment of the present invention includes a substrate and a vibration portion provided on the substrate, the vibration portion having a structure in which top and bottom surfaces of a thin film portion including at least one layer of piezoelectric thin film are sandwiched between at least a pair of upper and lower electrodes facing each other in the thickness direction, wherein first and second insulation films are arranged between the substrate and the vibration portion, and the temperature coefficient of resonant frequency of one of the first insulation film, the second insulation film, and the piezoelectric thin film and the temperature coefficients of resonant frequencies of the others have opposite signs.

According to preferred embodiments of the present invention, since the first and second insulation films and the piezoelectric thin film are defined by the film having a positive temperature coefficient of resonant frequency and the film having a negative temperature coefficient of resonant frequency, by setting the film thickness ratio thereof at a proper value, the temperature coefficient of resonant frequency is reduced and, therefore, the frequency temperature characteristic of the entire piezoelectric resonator is stabilized.

Preferably, in the piezoelectric resonator according to this preferred embodiment the present invention, one of the first and second insulation films primarily includes $Al_2O_3$ or $SiO_2$, or the first insulation film primarily includes $Al_2O_3$ and the second insulation film primarily includes $SiO_2$.

In this case, since the insulation film primarily including $SiO_2$ is subject to a compressive stress while the insulation film primarily including $Al_2O_3$ is subject to a tensile stress, the stress of the entire piezoelectric resonator is controlled, and since $Al_2O_3$ has a high thermal conductivity and outstanding exoergic compared with those of $SiO_2$, etc., the temperature increase of an element due to an input electric power can be reduced and, therefore, outstanding electric-power resistance can be achieved.

Preferably, in the piezoelectric resonator according to this preferred embodiment of the present invention, the arithmetic average surface roughness (Ra) of the lower electrode is preferably about 2.5 nm or less. With this arithmetic average the piezoelectric resonator achieves a Q of at least about 200. The arithmetic average surface roughness (Ra) is defined by the stipulation of JIS B0601-2001.

Preferably, in the piezoelectric resonator according to preferred embodiments of the present invention, the upper layer of the first and second insulation films primarily includes $Al_2O_3$, and the arithmetic average surface roughness (Ra) thereof is about 1.0 nm or less. According to this feature, the arithmetic average surface roughness (Ra) of the lower electrode provided on the upper layer insulation film is preferably about 2.5 nm or less, and the piezoelectric resonator achieves a Q of at least about 200.

Preferably, in the piezoelectric resonator according to preferred embodiments of the present invention, the upper layer of the first and second insulation films primarily includes $Al_2O_3$, and the stress therein is between about 250 MPa and about 400 MPa on a tensile stress basis. According to this feature, since film formation of the lower electrode provided on the upper layer insulation film is performed with outstanding orientation properties, a piezoelectric resonator having outstanding resonant characteristics is produced.

Preferably, in the piezoelectric resonator according to preferred embodiments of the present invention, the upper layer of the first and second insulation films primarily includes $SiO_2$, and the arithmetic average surface roughness (Ra) thereof is about 1.0 nm or less. According to this feature, the arithmetic average surface roughness (Ra) of the lower electrode provided on the upper layer insulation film is preferably about 2.5 nm or less, and the piezoelectric resonator achieves a Q of at least about 200.

Preferably, in the piezoelectric resonator according to preferred embodiments of the present invention, the upper layer of the first and second insulation films primarily includes $SiO_2$, and the stress therein is about 250 MPa or less on a compressive stress basis. According to this feature, since film formation of the lower electrode provided on the upper layer insulation film is performed with outstanding orientation properties, a piezoelectric resonator having outstanding resonant characteristics is produced.

Preferably, in the piezoelectric resonator according to preferred embodiments of the present invention, the first insulation film is arranged as the upper layer, the second insulation film is arranged as the lower layer, the film thickness ratio of piezoelectric thin film/(the first insulation film and second insulation film) is about 0.7 to about 1.2, and the film thickness ratio of the second insulation film/the first insulation film is between about 1 and about 3. According to this feature, since film formation of the lower electrode provided on the upper layer insulation film is performed with outstanding orientation, a piezoelectric resonator having outstanding resonant characteristics is produced.

Preferably, in the piezoelectric resonator according to preferred embodiments of the present invention, the first insulation film is arranged as the lower layer, the second insulation film is arranged as the upper layer, the film thickness ratio of piezoelectric thin film/(the first insulation film and second insulation film) is about 0.7 to about 1.2, and the film thickness ratio of the second insulation film/the first insulation film is between about 1 and about 3. According to this, since film formation of the lower electrode provided on the upper layer insulation film is performed with outstanding orientation, a piezoelectric resonator having outstanding resonant characteristics is produced.

Preferably, in the piezoelectric resonator according to preferred embodiments of the present invention, an anti-oxidation film is provided on the lower electrode. In this case, preferably, the anti-oxidation film is made of a metal primarily including any one selected from the group consisting of Au, Ru, Rh, Pd, Os, Ir, and Pt. In this case, preferably, the lower electrode is made of a metal primarily including any one selected from the group consisting of Al, Ni, Fe, Mn, Cu, Ti, Mo, W, Ta, and Ag. In this case, preferably, the anti-oxidation film is made of a metal primarily including Au, the lower electrode is made of a metal primarily including Al, and a diffusion prevention film is arranged between the anti-oxidation film and the lower electrode. In this case, preferably, the diffusion prevention film is made of a metal primarily including any one selected from the group consisting of Ag, Ru, Rh, Pd, Os, Ir, Pt, Mo, and Ti.

Preferably, in the piezoelectric resonator according to preferred embodiments of the present invention, $Al_2O_3$ in the first or second insulation film has an oxygen defect. In this case, preferably, $Al_2O_3$ in the first or second insulation film has oxygen defect, and the value of defect is within the range of about $0.05 \leq x \leq$ about 0.5 in terms of $Al_2O_{3-x}$. Although $Al_2O_3$ has a negative temperature coefficient, when $Al_2O_3$ in the insulation film is configured to have an oxygen defect as described above, $Al_2O_3$ has a positive temperature coefficient caused by the oxygen defect.

Preferably, in the piezoelectric resonator according to preferred embodiments of the present invention, $Al_2O_3$ in the first or second insulation film is in an amorphous state. Although $Al_2O_3$ has a negative temperature coefficient, since $Al_2O_3$ is in an amorphous state as described above, $Al_2O_3$ has a positive temperature coefficient.

Preferably, in the piezoelectric resonator according to preferred embodiments of the present invention, the piezoelectric thin film primarily includes ZnO or AlN. According to this feature, an outstanding frequency temperature characteristic is achieved by combining the first and second insulation films with the piezoelectric thin film primarily including ZnO or AlN.

Preferably, in the piezoelectric resonator according to preferred embodiments of the present invention, the substrate has an opening or a concavity, and the vibration portion is arranged on the opening or concavity. According to this feature, the piezoelectric resonator provided with the vibration portion on the opening or concavity of the substrate has a greatly reduced temperature coefficient of resonant frequency and, therefore, the frequency temperature characteristics are stabilized.

A piezoelectric filter, duplexer, and communication apparatus according to preferred embodiments of the present invention include the piezoelectric resonator according to preferred embodiments of the present invention. According to this feature, the piezoelectric filter, duplexer, and communication apparatus according to preferred embodiments of the present invention have outstanding frequency temperature characteristics and resonant characteristics.

A method according to another preferred embodiment for manufacturing a piezoelectric resonator including a substrate, first and second insulation films provided on the substrate, and a structure which is provided on the first and second insulation films and in which top and bottom surfaces of a thin film portion including at least one layer of piezoelectric thin film are sandwiched between at least a pair of upper and lower electrodes facing each other in the thickness direction, includes the step of forming an insulation film primarily including $Al_2O_3$ by a vacuum evaporation method while the pressure in a film formation apparatus before the start of film formation is less than about $3.0 \times 10^{-4}$ Pa, wherein the insulation film primarily including $Al_2O_3$ is the upper layer of the first and second insulation films. According to this method, a piezoelectric resonator having an outstanding frequency temperature characteristic is efficiently manufactured.

Another method according to another preferred embodiment of the present invention for manufacturing a piezoelectric resonator including a substrate, first and second insulation films provided on the substrate, and a structure which is provided on the first and second insulation films and in which top and bottom surfaces of a thin film portion including at least one layer of piezoelectric thin film are sandwiched between at least a pair of upper and lower electrodes facing each other in the thickness direction, includes the step of forming an insulation film primarily including $Al_2O_3$ by an electron beam evaporation method at a film thickness growth rate of about 0.6 nm/sec to about 1.0 nm/sec, wherein the insulation film primarily including $Al_2O_3$ is the upper layer of the first and second insulation films. According to this method, a piezoelectric resonator having an outstanding frequency temperature characteristic is efficiently manufactured.

A further method according to another preferred embodiment of the present invention for manufacturing a piezoelectric resonator including a substrate, first and second insulation films provided on the substrate, and a structure which is provided on the first and second insulation films and in which top and bottom surfaces of a thin film portion including at least one layer of piezoelectric thin film are sandwiched between at least a pair of upper and lower electrodes facing each other in the thickness direction, includes the step of forming an insulation film primarily including $SiO_2$ by an RF magnetron sputtering method while the power density is within the range of about 2.0 W/cm$^2$ to about 8.5 W/cm$^2$, wherein the insulation film primarily including $SiO_2$ is the upper layer of the first and second insulation films. In this case, the gas pressure during film formation by the RF magnetron sputtering method is preferably about 0.6 Pa or less. According to this method, a piezoelectric resonator having an outstanding frequency temperature characteristic is efficiently manufactured.

A piezoelectric resonator according to another preferred embodiment of the present invention includes a substrate, an insulation film provided on the substrate, and a vibration portion which is provided on the insulation film, the vibration portion having a structure in which top and bottom surfaces of a thin film portion including at least one layer of piezoelectric thin film are sandwiched between at least a pair of upper and lower electrodes facing each other in the thickness direction, wherein the arithmetic average surface roughness (Ra) of the lower electrode is about 2.5 nm or less.

Here, the surface roughness (Ra) on an arithmetic average surface roughness basis is defined by the stipulation of JIS B0601-2001.

In the piezoelectric resonator according to this preferred embodiment of the present invention, since the arithmetic average surface roughness (Ra) of the lower electrode is about 2.5 nm or less, the lower electrode has greatly improved flatness. Consequently, film formation of the piezoelectric vibration portion located on the insulation film is performed with outstanding crystallinity and orientation properties and, therefore, outstanding resonant characteristics are achieved.

Preferably, in the piezoelectric resonator according to this preferred embodiment of the present invention, the surface of the insulation film has an arithmetic average surface roughness (Ra) of about 1.0 nm or less, the stress in the insulation film is preferably about 250 MPa or less on a compressive stress basis and about 400 MPa or less on a tensile stress basis. According to this feature, the flatness of the lower electrode is further improved, film formation of the piezoelectric vibration portion formed on the insulation film is performed with outstanding crystallinity and orientation properties and, therefore, further improved resonant characteristics are achieved. In addition, since the stress in the insulation film is small, breakage of the insulation film itself and breakage of the piezoelectric vibration portion due to the stress is eliminated. Consequently, since degradation of characteristics and failure of the vibration portion being warped due to the stress is prevented and, in addition, breakage of the vibration portion due to the stress is prevented, and thus, the conforming item rate of the piezoelectric resonators is greatly improved.

Preferably, in the piezoelectric resonator according to this preferred embodiment of the present invention, the insulation film primarily includes $Al_2O_3$, and the arithmetic average surface roughness (Ra) thereof is about 1.0 nm or less.

Preferably, in the piezoelectric resonator according to this preferred embodiment of the present invention, the insulation film primarily includes $Al_2O_3$, and the stress therein is 250 MPa or more, but 400 MPa or less on a tensile stress basis.

Preferably, in the piezoelectric resonator according to preferred embodiments of the present invention, the insulation film primarily includes $SiO_2$, and the arithmetic average surface roughness (Ra) thereof is about 1.0 nm or less.

Preferably, in the piezoelectric resonator according to preferred embodiments of the present invention, the insulation film primarily includes $SiO_2$, and the stress therein is about 250 MPa or less on a compressive stress basis.

Preferably, in the piezoelectric resonator according to preferred embodiments of the present invention, an anti-oxidation film is provided on the lower electrode. In this case, preferably, the anti-oxidation film is made of a metal primarily including any one selected from the group consisting of Au, Ru, Rh, Pd, Os, Ir, and Pt. In this case, preferably, the lower electrode is made of a metal primarily including any one selected from the group consisting of Al, Ni, Fe, Mn, Cu, Ti, Mo, W, Ta, and Ag. In this case, preferably, the anti-oxidation film is made of a metal primarily containing Au, the lower electrode is made of a metal primarily including Al, and a diffusion prevention film is arranged between the anti-oxidation film and the lower electrode. This diffusion prevention film is preferably made of a metal primarily containing any one selected from the group consisting of Ag, Ru, Rh, Pd, Os, Ir, Pt, Mo, and Ti.

Preferably, in the piezoelectric resonator according to preferred embodiments of the present invention, the substrate includes an opening or a concavity, and the vibration portion is arranged on the opening or concavity.

Preferably, in the piezoelectric resonator according to preferred embodiments of the present invention, the surface of the insulation film preferably has an arithmetic average surface roughness (Ra) of about 0.7 nm or less, and optimally, has an arithmetic average surface roughness (Ra) of about 0.4 nm or less. Preferably, the stress in the insulation film is preferably about 200 MPa or less on a compressive stress basis, and optimally, about 170 MPa or less.

A piezoelectric filter according to preferred embodiments of the present invention is provided with the piezoelectric resonator according to preferred embodiments of the present invention as a filter element. Another piezoelectric filter according to preferred embodiments of the present invention is provided with a plurality of piezoelectric resonators according to preferred embodiments of the present invention as filter elements, and these filter elements are connected so as to have a ladder type configuration. A duplexer according to preferred embodiments of the present invention is provided with the piezoelectric resonator according to preferred embodiments of the present invention. Furthermore, another duplexer according to preferred embodiments of the present invention is provided with the piezoelectric filter according to preferred embodiments of the present invention.

The piezoelectric filter and duplexer according to preferred embodiments of the present invention is provided with the piezoelectric resonator having outstanding characteristics and, therefore, when adopted for communication apparatuses, outstanding performance is achieved regarding the functions as a filter and switching of signals.

Yet another method according to another preferred embodiment of the present invention for manufacturing a piezoelectric resonator including a substrate, an insulation film provided on the substrate, and a vibration portion provided on the insulation film, the vibration portion having a structure in which top and bottom surfaces of a thin film portion including at least one layer of piezoelectric thin film are sandwiched between at least a pair of upper and lower electrodes facing each other in the thickness direction, includes a step of forming the insulation film from silicon oxide as a primary component by an RF magnetron sputtering method while the power density is within the range of about 2.0 W/cm$^2$ to about 8.5 W/cm$^2$ and forming the piezoelectric thin film from zinc oxide as a primary component.

According to this method for manufacturing a piezoelectric resonator, since the insulation film is formed by the RF magnetron sputtering method in the condition that the power density thereof is large, the stress is adjusted to be small, and film formation is performed with outstanding flatness of the surface.

In this method for manufacturing a piezoelectric resonator, the gas pressure during film formation by the RF magnetron sputtering method is preferably about 0.6 Pa or less. Here, the gas pressure refers to a gas pressure in a film formation apparatus when film formation is performed by the RF magnetron sputtering method. According to the RF magnetron sputtering method, in general, a dense and smooth film (that is, a film having a small arithmetic average surface roughness (Ra)) is formed.

A further method according to another preferred embodiment of the present invention for manufacturing a piezoelectric resonator including a substrate, first and second insulation films provided on the substrate, and a vibration portion provided on the first and second insulation films, the vibration portion having a structure in which top and bottom surfaces of a thin film portion including at least one layer of piezoelectric thin film are sandwiched between at least a pair of upper and lower electrodes facing each other in the thickness direction, includes the step of forming an insulation film primarily including Al$_2$O$_3$ by a vacuum evaporation method while the pressure in a film formation apparatus before the start of film formation is preferably less than about 3.0×10$^{-4}$ Pa, wherein the insulation film primarily including Al$_2$O$_3$ is the upper layer of the first and second insulation films.

According to this method for manufacturing a piezoelectric resonator, the surface of the insulation film is flattened and, in addition, the stress is greatly reduced.

Another method according to another preferred embodiment of the present invention for manufacturing a piezoelectric resonator including a substrate, an insulation film provided on the substrate, and a vibration portion provided on the insulation film, the vibration portion having a structure in which top and bottom surfaces of a thin film portion including at least one layer of piezoelectric thin film are sandwiched between at least a pair of upper and lower electrodes facing each other in the thickness direction, includes the first step of forming the insulation film from aluminum oxide as a primary component by an electron beam evaporation method at a film thickness growth rate within the range of about 0.6 m/sec to about 1.0 nm/sec and the second step of forming the piezoelectric thin film from zinc oxide as a primary component.

According to this method for manufacturing a piezoelectric resonator, the surface of the insulation film is flattened and, in addition, the stress is greatly reduced.

Other features, elements, steps, characteristics and advantages of the present invention will become more apparent from the following detailed description of preferred embodiments thereof with reference to the attached drawings.

BRIEF DESCRIPTION OF THE DRAWINGS

FIG. 6A shows the case where the lower layer of the insulation film is an Al$_2$O$_3$ film and the upper layer of the insulation film is a SiO$_2$ film. FIG. 6B shows the case where the lower layer of the insulation film is a SiO$_2$ film and the upper layer of the insulation film is an Al$_2$O$_3$ film.

DETAILED DESCRIPTION OF PREFERRED EMBODIMENTS

Preferred embodiments of the present invention will be described below with reference to the drawings.

First Preferred Embodiment

Figure 1:
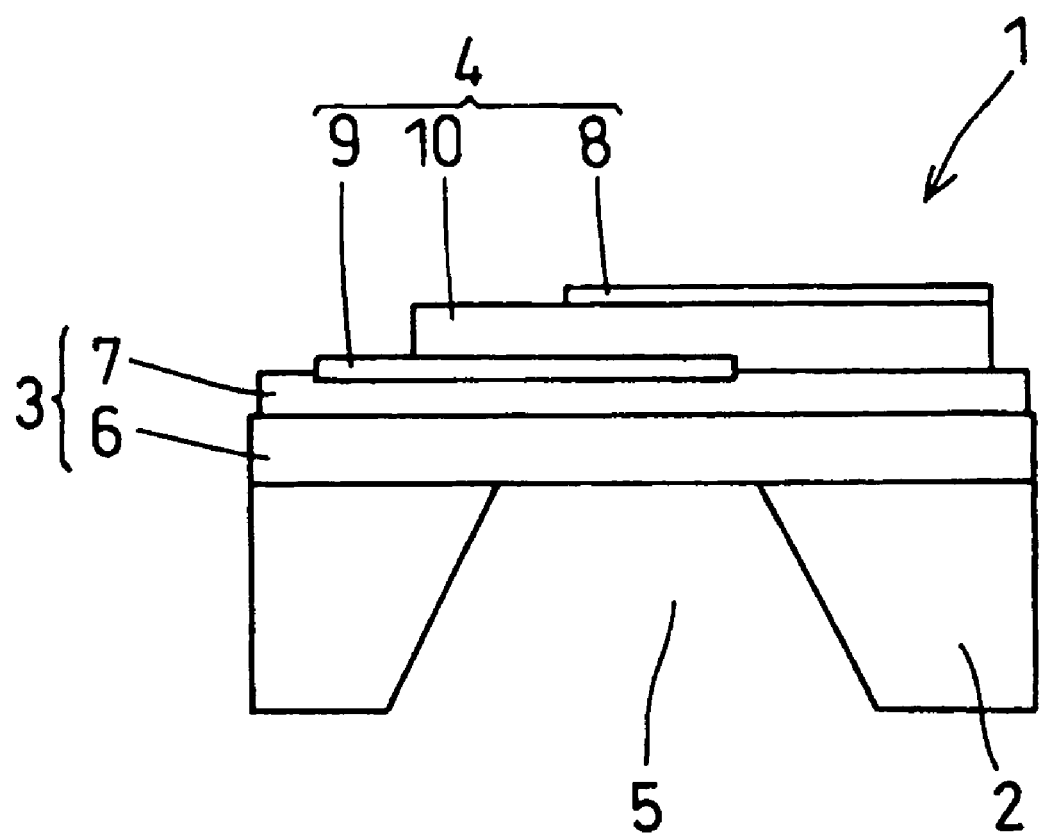
FIG. 1 is a sectional view of a piezoelectric resonator according to a preferred embodiment of the present invention.

FIG. 1 is a sectional view showing the structure of a piezoelectric resonator according to a preferred embodiment of the present invention.

The piezoelectric resonator 1 of the present preferred embodiment is provided with a substrate 2, insulation thin film 3, and piezoelectric element portion 4.

The substrate 2 is made of silicon, for example, and has an opening 5 penetrating the top and bottom surfaces corresponding to a vibration portion. The insulation thin film 3 is arranged on the substrate 2 while covering the opening 5, and has a $SiO_2$ film 6 primarily including $SiO_2$ as a first insulation thin film and an $Al_2O_3$ film 7 primarily including $Al_2O_3$ as a second insulation thin film.

The piezoelectric element portion 4 is defined by a piezoelectric thin film 10 which primarily includes ZnO and which is sandwiched between a pair of upper and lower electrodes 8 and 9.

The piezoelectric resonator 1 of the present preferred embodiment is provided with the $SiO_2$ film 6, $Al_2O_3$ film 7, and the piezoelectric thin film 10 primarily including ZnO. Since $SiO_2$ has a positive temperature coefficient, $Al_2O_3$ has a negative temperature coefficient, and ZnO has a negative temperature coefficient, the temperature coefficient of resonant frequency is reduced to close to zero and, therefore, the temperature coefficient of resonant frequency is stabilized by properly setting the film thickness ratio among them. The stress in the $Al_2O_3$ film 7 is a tensile stress of between about 250 MPa and about 400 MPa.

Table 1 shows the relationship between the film thickness ratio and the frequency temperature characteristic of this piezoelectric resonator 1. In Table 1, $T_{ZnO}/T_{Al2O3}/T_{SiO2}$ indicates the film thickness ratio of the piezoelectric thin film 10, $Al_2O_3$ film 7, and $SiO_2$ film 6.

TABLE 1

| Structure<br>Film thickness ratio | Frequency temperature characteristic<br>(ppm/° C.) |
|---|---|
| $T_{ZnO}/T_{Al2O3}/T_{SiO2}$ =<br>0.46/0.15/0.39 | about 3 |
| $T_{ZnO}/T_{Al2O3}/T_{SiO2}$ =<br>0.51/0.19/0.30 | about 6 |

As is clear from Table 1, the temperature coefficients are relatively small positive values.

Figure 2:
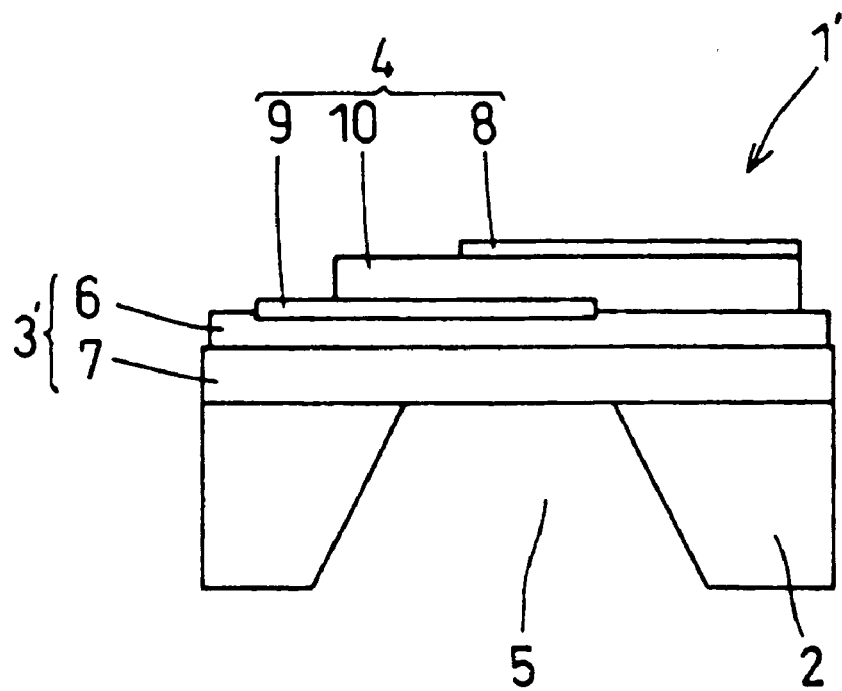
FIG. 2 is a sectional view of a piezoelectric resonator according to another preferred embodiment of the present invention.
Figure 3:
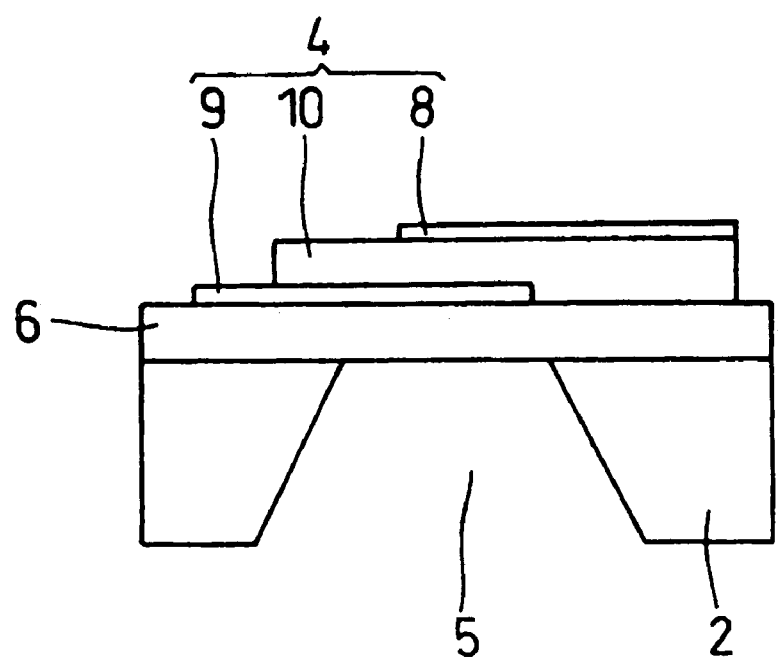
FIG. 3 is a sectional view of a piezoelectric resonator having a two-layer structure of ZnO and SiO$_2$ without an Al$_2$O$_3$ film.

Table 2 shows the relationship between the film thickness ratio and the resonant characteristics of this piezoelectric resonator 1. In Table 2, each of the characteristics Q, $k^2$, and $Q \times k^2$ is shown with respect to the film thickness ratio of the piezoelectric thin film 10, $Al_2O_3$ film 7, and $SiO_2$ film 6, $T_{ZnO}/T_{Al2O3}/T_{SiO2}$. In Table 2, the characteristics with respect to the film thickness ratio of the piezoelectric thin film 10, $SiO_2$ film 6, and $Al_2O_3$ film 7, $T_{ZnO}/T_{SiO2}/T_{Al2O3}$, in a piezoelectric resonator 1' of another preferred embodiment of the present invention are shown, wherein as shown in FIG. 2, the constituent materials of the first and second insulation thin films are interchanged, that is, the first insulation thin film is specified to be the $Al_2O_3$ film 7 primarily including $Al_2O_3$, and the second insulation thin film is specified to be the $SiO_2$ film 6 primarily including $SiO_2$ and, in addition, for purposes of comparison, the characteristics with respect to the two-layer structure of ZnO and $SiO_2$ without formation of $Al_2O_3$ as shown in FIG. 3 are shown. Regarding the piezoelectric resonator 1' shown in FIG. 2, the stress in the $SiO_2$ film 6 is a compressive stress of about 250 MPa or less.

TABLE 2

| Structure | Characteristics | | |
|---|---|---|---|
| Film thickness ratio | Q | $k^2$ (%) | $Q \times k^2$ |
| $T_{ZnO}/T_{SiO2}$ =<br>0.52/0.48 | 140 | 6.4 | 910 |
| $T_{ZnO}/T_{Al2O3}/T_{SiO2}$ =<br>0.47/0.15/0.38 | 210 | 5.7 | 1220 |
| $T_{ZnO}/T_{SiO2}/T_{Al2O3}$ =<br>0.47/0.38/0.15 | 140 | 7.0 | 990 |

As is clear from Table 2, the value of $Q \times k^2$ of the three-layer structure of the piezoelectric thin film 10 of ZnO, $Al_2O_3$ film 7, and $SiO_2$ film 6, becomes greater than that of the two-layer structure of the piezoelectric thin film of ZnO and $SiO_2$ and, therefore, the performance of the resonator is greatly improved.

Figure 4:
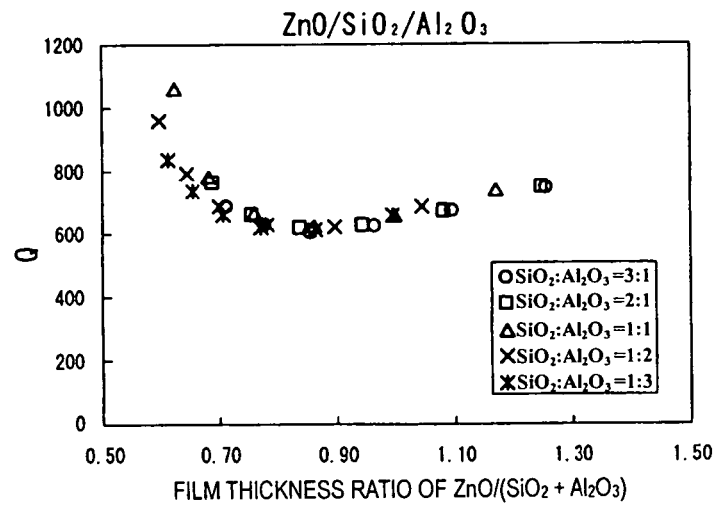
FIG. 4 includes graphs showing the relationship between the film thickness ratio of piezoelectric thin film/insulation film and Q, k$^2$, and TCF in the upper, middle, and lower columns, respectively, with changes in film thickness ratio of SiO$_2$ film to Al$_2$O$_3$ film where the upper layer of the insulation film is the SiO$_2$ film and the lower layer is the Al$_2$O$_3$ film.
Figure 4:
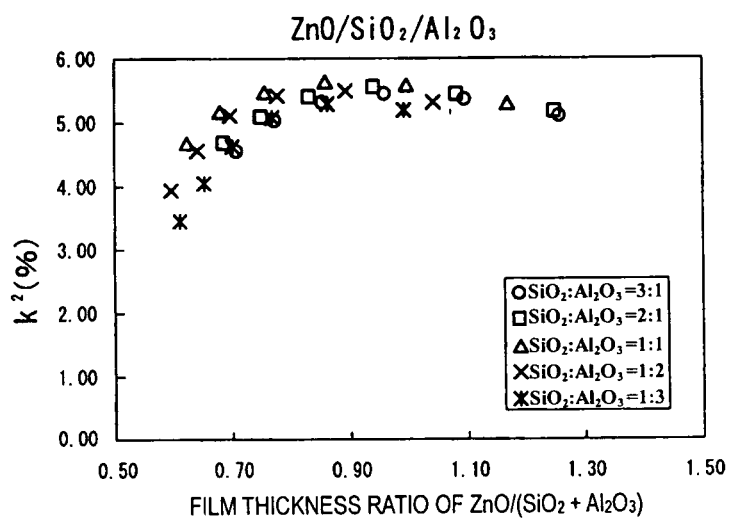
Figure 4:
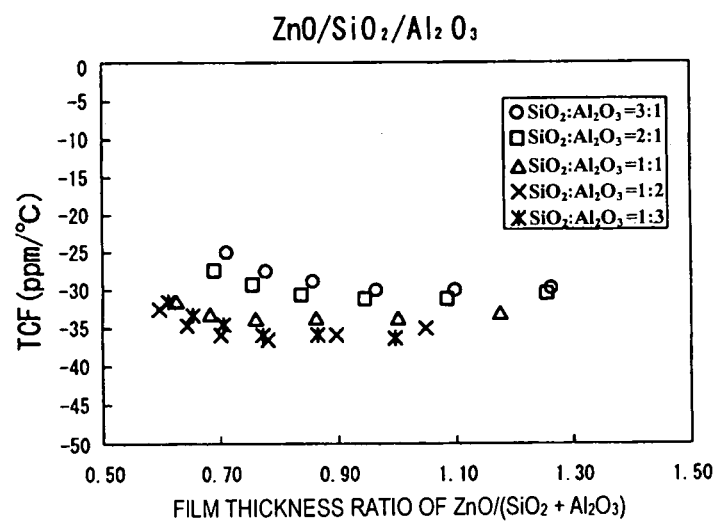
Figure 5:
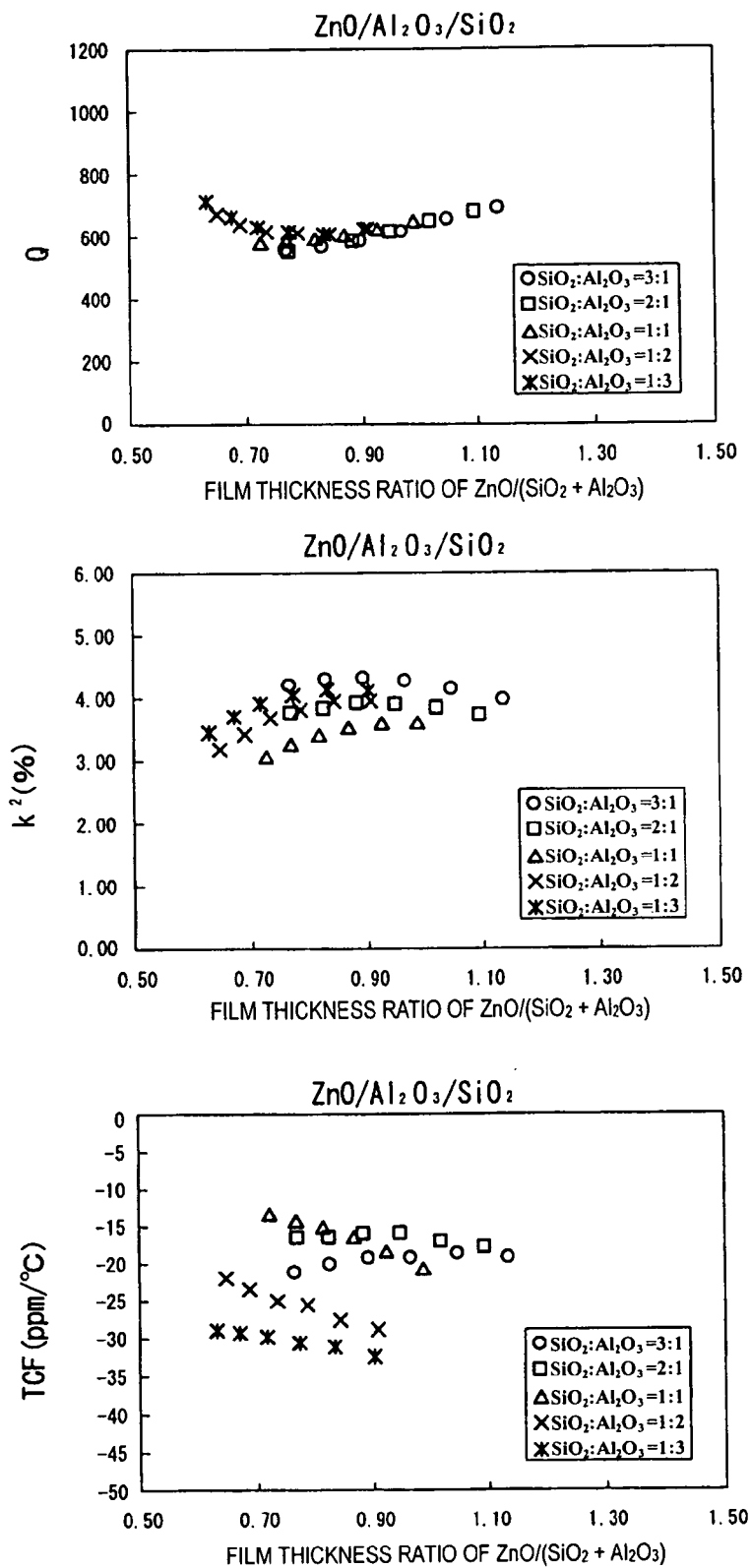
FIG. 5 includes graphs showing the relationship between the film thickness ratio of piezoelectric thin film/insulation film and Q, k$^2$, and TCF in the upper, middle, and lower columns, respectively, with changes in film thickness ratio of SiO$_2$ film to Al$_2$O$_3$ film where the upper layer of the insulation film is the Al$_2$O$_3$ film and the lower layer is the SiO$_2$ film.

FIG. 4 and FIG. 5 show characteristics of the resonator when the film thickness is changed based on a simulation performed by the inventors of the present invention. FIG. 4 shows the results with respect to the structure of upper electrode/ZnO/lower electrode/$SiO_2$/$Al_2O_3$, and FIG. 5 shows the results with respect to the structure of upper electrode/ZnO/lower electrode/$Al_2O_3$/$SiO_2$. The calculation is performed based on the assumption that the upper and lower electrodes sandwiching ZnO are made of Al and the film thicknesses are fixed at about 180 nm. Each drawing shows the calculation result when the film thickness ratio of $SiO_2$ to $Al_2O_3$ is changed from 3:1 to 1:3 in five steps while the axis of abscissas indicates the film thickness ratio of ZnO/($SiO_2$+$Al_2O_3$). Regarding graphs shown in three columns vertically arranged in FIG. 4 and FIG. 5, the graph in the upper column indicates the relationship between the film thickness ratio and Q, the graph in the middle column indicates the relationship between the film thickness ratio and $k^2$, and the graph in the lower column indicates the relationship between the film thickness ratio and frequency temperature characteristic (TCF). The absolute value of each film thickness is determined such that the frequency band of the resonator is about 1,900 MHz.

Figure 6A:
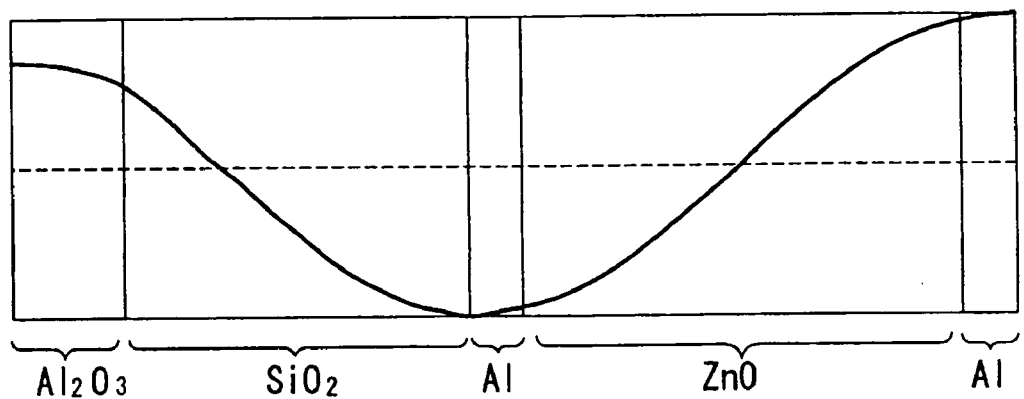
FIGS. 6A and 6B show displacement diagrams of vibration in a vibration portion including an insulation film. In the drawings, the axis of abscissas indicates the vibration portion while the thickness widths of the insulation film, piezoelectric film, and electrode film in the thickness direction correspond to the horizontal widths, and the axis of ordinates indicates the displacement of vibration.
Figure 6B:
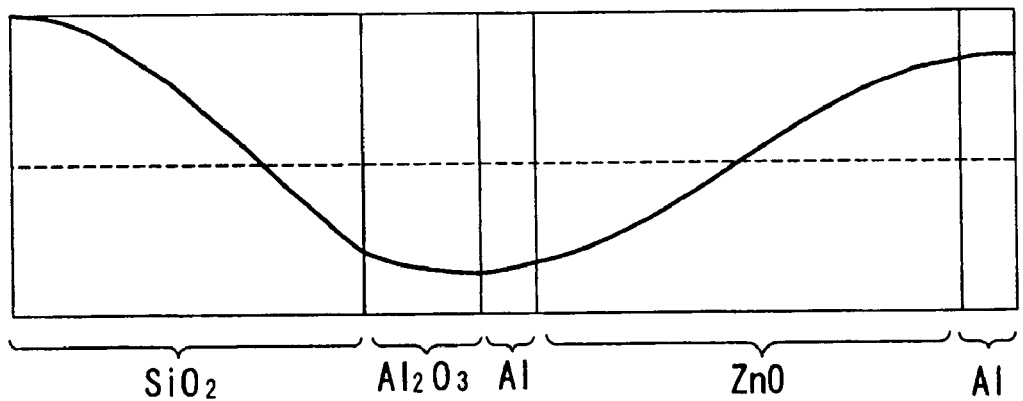

The structure of upper electrode/ZnO/lower electrode/$SiO_2$/$Al_2O_3$ has the $k^2$ greater than that of the structure of upper electrode/ZnO/lower electrode/$Al_2O_3$/$SiO_2$. This is because the acoustic impedance of $SiO_2$ is about $1.3 \times 10^7$ (N·s/m$^3$), and is less than about $3.5 \times 10^7$ (N·s/m$^3$) of ZnO and about $3.9 \times 10^7$ (N·s/m$^3$) of $Al_2O_3$ (wherein the value of $Al_2O_3$ is the value of a single crystal (sapphire), and the practical value is estimated to be about $2.3 \times 10^7$ (N·s/m$^3$). Since the interface having a greater difference in impedance is more likely to reflect sound waves, the reflection at a ZnO/$SiO_2$ interface is increased and, therefore, energy is concentrated on ZnO as a piezoelectric film such that the $k^2$ increases. FIGS. 6A and 6B show displacement diagrams of vibration, and it is clear that the displacement in ZnO is greater than the displacement in $SiO_2$. In the diagrams shown in FIGS. 6A and 6B, the axis of abscissas indicates the vibration portion while the thickness widths of the insulation film, piezoelectric film, and electrode film in the thickness direction correspond to the horizontal widths, and the axis of ordinates indicates the displacement of vibration. FIG. 6A shows the situation where the lower layer of the insulation film is an $Al_2O_3$ film and the upper layer of the insulation film is a SiO₂ film. FIG. 6B shows the situation where the lower layer of the insulation film is a SiO₂ film and the upper layer of the insulation film is an Al₂O₃ film.

On the other hand, the structure of upper electrode/ZnO/ lower electrode/Al₂O₃/SiO₂ has the absolute value of the TCF (temperature change rate of frequency) that is less than that of the structure of upper electrode/ZnO/lower electrode/ SiO₂/Al₂O₃. The temperature coefficients of the materials of ZnO and Al₂O₃ are negative (frequency decreases with increase in temperature), while that of SiO₂ is positive. Consequently, as is clear from FIGS. 6A and 6B, the structure of ZnO/Al₂O₃/SiO₂ exhibiting large displacement in SiO₂ is significantly affected by the temperature coefficient of SiO₂ and, therefore, the total temperature coefficient shifts in the positive direction (approaches zero).

Regarding the optimum film thickness in the structure of upper electrode/ZnO/lower electrode/SiO₂/Al₂O₃, the film thickness ratio of ZnO/(SiO₂+Al₂O₃) is about 0.7 to about 1.2 from the standpoint of an increase in $k^2$, while the ratio is about 0.6 to about 0.8 from the standpoint of an increase in Q. From the standpoint of TCF, the film thickness ratio of SiO₂:Al₂O₃ is preferably at least about 1. However, since a problem of stress balance occurs when the ratio is substantially reduced, the film thickness ratio of SiO₂:Al₂O₃ is preferably between about 1 and about 3.

Regarding the optimum film thickness in the structure of upper electrode/ZnO/lower electrode/Al₂O₃/SiO₂, the film thickness ratio of SiO₂:Al₂O₃ is preferably about 1 or more from the standpoint of reduction of the TCF. The dependence on the film thickness of ZnO is small, and the effectiveness is verified in the entire range checked at this time. Consequently, the film thickness ratio of ZnO/(SiO₂+ Al₂O₃) is about 0.7 to about 1.2, and the film thickness ratio of SiO₂:Al₂O₃ is at least about 1. However, since a problem of stress also occurs here, the film thickness ratio of SiO₂: Al₂O₃ is preferably between about 1 and about 3.

Next, a method for manufacturing this piezoelectric resonator 1 will be described.

The SiO₂ film 6 is formed on the top surface of the substrate 2 by a thermal oxidation method, sputtering method, or other suitable method. The opening 5 is formed with respect to the bottom surface of the substrate 2 by anisotropic etching, RIE (Reactive Ion Etching), or other suitable method.

The Al₂O₃ film 7 is formed on the SiO₂ film 6 by a film forming method, for example, an electron beam evaporation method and sputtering method. For example, film formation of the Al₂O₃ film 7 is performed by the electron beam evaporation method using aluminum oxide as an evaporation source at a film growth rate of about 0.8 nm/sec or less. The lower layer electrode 9 is formed on this Al₂O₃ film 7 by evaporation, sputtering, or other suitable method. The film growth rate of the Al₂O₃ film 7 is preferably about nm/sec 0.6 to about 1.0 nm/sec to improve manufacturing efficiency.

The piezoelectric thin film 10 primarily including ZnO is formed on the lower layer electrode 9 and the Al₂O₃ film 7 by a film formation method, for example, sputtering and CVD. For example, a highly oriented film is manufactured by an RF sputtering method using a ZnO target at a substrate temperature of about 50° C. to about 500° C., an RF power of about 300 W to about 1,500 W, and a gas pressure of about 0.05 Pa to about 0.8 Pa. The upper layer electrode 8 is formed on this piezoelectric thin film 10 in a similar manner to that for the lower layer electrode 9.

In the piezoelectric thin film resonator 1 manufactured as described above, since both the piezoelectric thin film 10 primarily including ZnO and the SiO₂ film 6 are subject to a compressive stress while the Al₂O₃ film 7 is subject to a tensile stress, the stress in the total piezoelectric thin film resonator 1 is greatly reduced and, therefore, failures due to cracking of the element are greatly reduced.

Furthermore, as shown in Table 3, since Al₂O₃ has a thermal conductivity greater than SiO₂, outstanding heat-dissipation properties and outstanding electric-power resistance are achieved.

TABLE 3

| Material | ZnO | SiO₂ | Al₂O₃ |
| --- | --- | --- | --- |
| Thermal conductivity (cal/s · cm² · ° C.) | 0.06 | 0.002 to 0.003 | 0.04 to 0.08 |

In the film having no oxygen defect, Al₂O₃ has a negative temperature coefficient as described above. However, when Al₂O₃ has oxygen defect and is in an amorphous state, Al₂O₃ has a positive temperature coefficient. Consequently, in another preferred embodiment of the present invention, by providing Al₂O₃ with oxygen defect, for example, by providing Al₂O₃ in the amorphous state, the Al₂O₃ film has a positive temperature coefficient, and can be combined with the piezoelectric thin film primarily including ZnO and having a negative temperature coefficient so as to achieve an outstanding frequency temperature characteristic.

Regarding Al₂O₃ having oxygen defect, the value of defect is preferably within the range of about $0.05 \leq x \leq$ about 0.5 in terms of $Al_2O_{3-x}$.

Figure 7:
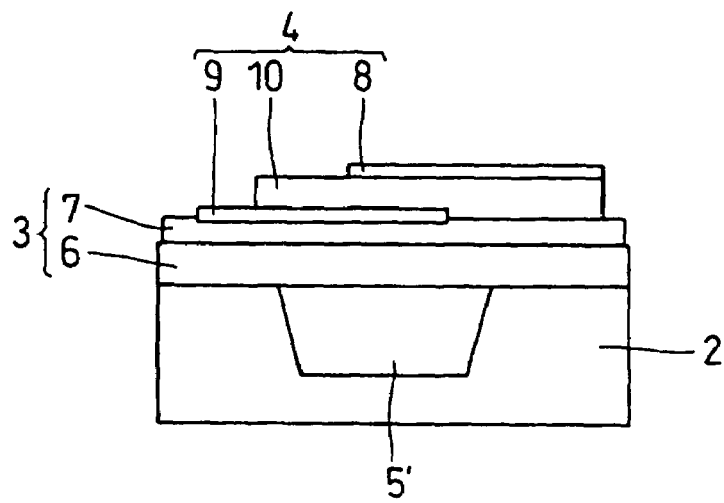
FIG. 7 is a sectional view of a piezoelectric resonator according to another preferred embodiment of the present invention.

In this preferred embodiment, the insulation thin film 3 and the piezoelectric element portion 4 are disposed on the opening 5 of the substrate 2. However, as another preferred embodiment of the present invention, the insulation thin film 3 and the piezoelectric element portion 4 may be disposed on a concavity 5' of the substrate 2 as shown in FIG. 7.

Figure 8:
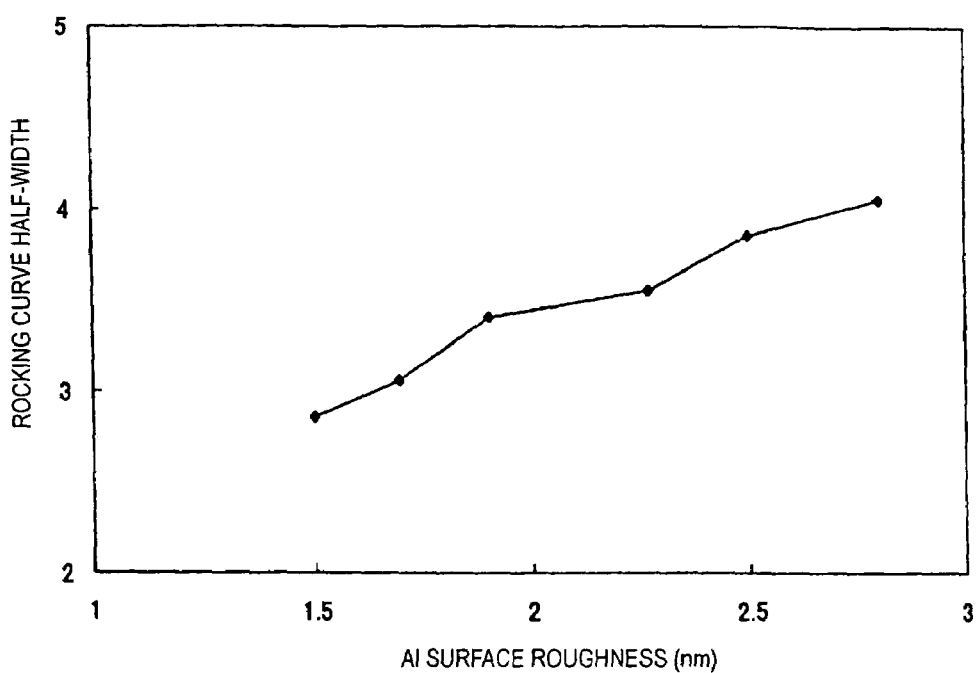
FIG. 8 is a graph showing the relationship between the surface roughness of a lower electrode and the rocking curve half-width of a piezoelectric thin film.
Figure 9:
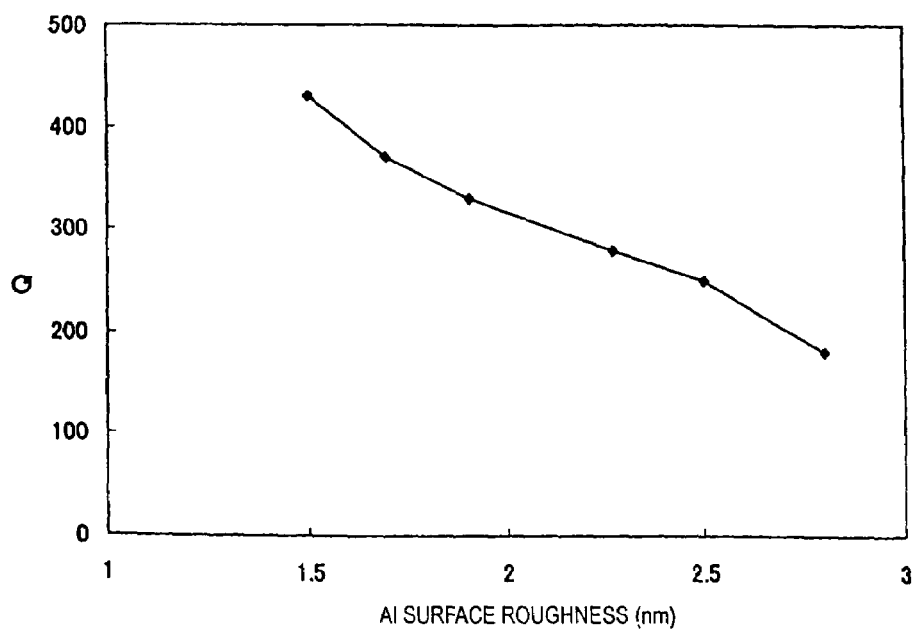
FIG. 9 is a graph showing the relationship between the surface roughness of a lower electrode and the Q.

It is clear from FIG. 8 and FIG. 9 (showing the measurement results of the experiments performed by the inventors of the present invention) that when the arithmetic average surface roughness (Ra) of the lower electrode is reduced, the orientation property of the piezoelectric film arranged thereon is greatly improved and outstanding resonant characteristics are achieved. Here, FIG. 8 shows the relationship between the surface roughness of the lower electrode and the rocking curve half-width of the piezoelectric thin film, and FIG. 9 shows the relationship between the surface roughness of the lower electrode and the Q. The Q required for a resonator used for a ladder filter is at least about 200, and as shown in FIG. 9, when the arithmetic average surface roughness (Ra) of the lower electrode is about 2.5 nm or less, the Q of the resonator is at least about 200. Consequently, in order to produce the resonator having a Q of at least about 200 suitable for defining the ladder filter, the arithmetic average surface roughness (Ra) of the lower electrode must be about 2.5 nm or less.

Figure 10:
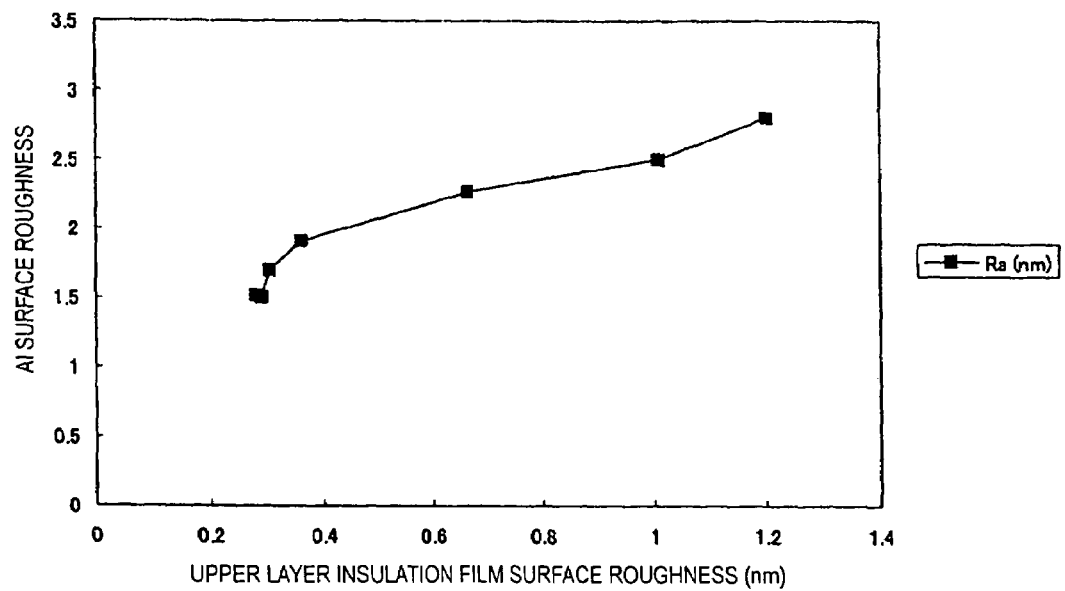
FIG. 10 is a graph showing the relationship between the surface roughness of the upper layer insulation film and the surface roughness of a lower electrode.

In order to form the lower electrode having an arithmetic average surface roughness (Ra) of about 2.5 nm or less, the arithmetic average surface roughness (Ra) of an insulation film to become a substrate thereof must be small. As is clearly shown in FIG. 10 (showing the measurement results of the experiments performed by the inventors of the present invention), when the arithmetic average surface roughness (Ra) of the upper layer insulation film is about 1.0 nm or less, the arithmetic average surface roughness (Ra) of the lower electrode arranged thereon is about 2.5 nm or less.

That is, by setting the arithmetic average surface roughness (Ra) of the insulation film to about 1.0 nm or less, the lower electrode having an arithmetic average surface roughness (Ra) of about 2.5 nm or less is produced, the piezoelectric thin film having high orientation property is produced and, by extension, the resonator having a Q of at least about 200 suitable for defining the ladder filter is produced.

EXAMPLES

Film Formation Method (1) for $Al_2O_3$

Figure 11:
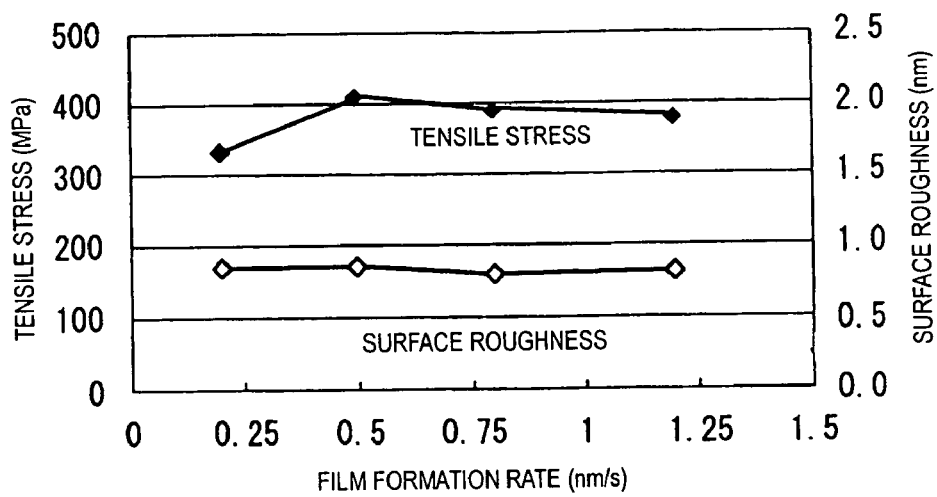
FIG. 11 is a graph showing the relationship between the film formation rate and the tensile stress and the relationship between the film formation rate and the surface roughness in a preferred embodiment of the present invention.

The inventors of the present invention performed research regarding a film formation method for the insulation film of $Al_2O_3$ having the arithmetic average surface roughness (Ra) of about 1.0 nm or less. In order to investigate the relationship between the film formation rate and the stress and surface roughness of the resulting insulation film, the inventors of the present invention formed films by an electron beam evaporation method while only the individual film formation rates were differentiated and other condition were maintained substantially the same and, thereby, the results as shown in FIG. 11 were obtained. As is clear from FIG. 11, it was verified that the film formation rate did not substantially affect the stress and surface roughness of the resulting insulation film. FIG. 11 is a graph showing the relationship between the film formation rate and the tensile stress and the relationship between the film formation rate and the surface roughness while the axis of abscissas indicates the film formation rate, and the axis of ordinates indicates the tensile stress and the surface roughness.

Figure 12:
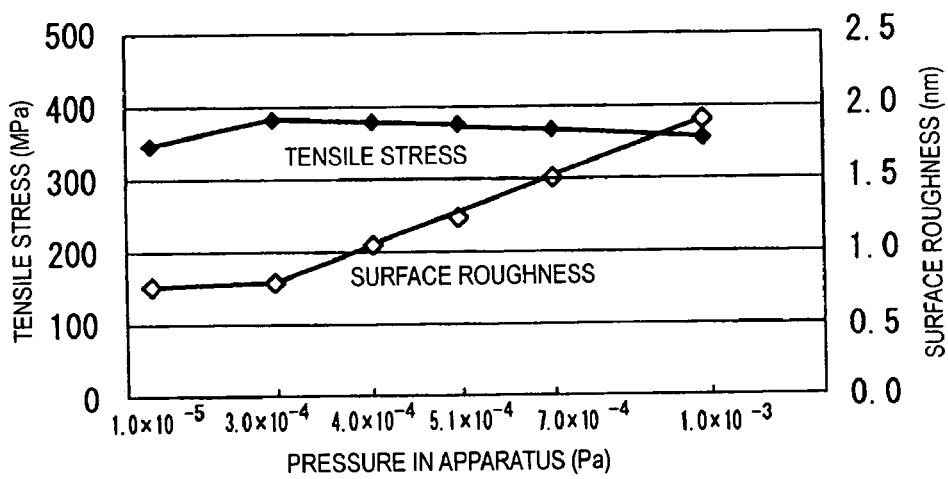
FIG. 12 is a graph showing the relationship between the degree of vacuum in an apparatus and the tensile stress and the relationship between the film formation rate and the surface roughness in a preferred embodiment of the present invention.

Next, the inventors of the present invention formed films by an electron beam evaporation method as an example of the same vacuum evaporation method while only the individual pressures in the film formation apparatus before starting film formation were differentiated and other conditions were not changed, for example, all of the film formation rates were about 0.8 nm/sec, and thereby, the results as shown in FIG. 12 were obtained. As is clearly shown in FIG. 12, when the film formation was performed while the pressure in the film formation apparatus before starting film formation was less than about $3.0 \times 10^{-4}$ Pa, the insulation film having an arithmetic average surface roughness (Ra) of about 1.0 nm or less were produced. FIG. 12 is a graph showing the relationship between the degree of vacuum in the apparatus and the tensile stress and the relationship between the film formation rate and the surface roughness while the axis of abscissas indicates the degree of vacuum on a pressure basis in the apparatus when the vacuum evaporation is performed, and the axis of ordinates indicates the tensile stress and the surface roughness.

It is considered that this result is brought about by the purity of the film formed. Regarding particles of $Al_2O_3$ heated and vaporized in a crucible, the purity reaches a maximum value and the particle size reaches a minimum value immediately after flying from the crucible. However, when floating impurities are present in the film formation apparatus, the particles of $Al_2O_3$ chemically react with the particles of the impurities before the particles of $Al_2O_3$ reach the substrate and, as a result, the purity of the resulting film is reduced. Accompanying that, the particle size becomes greater than the size at the time of vaporization, and a coarse film, that is, a film having a large arithmetic average surface roughness (Ra) is produced. Consequently, it is necessary to reduce impurities floating in the film formation apparatus. The pressure in the film formation apparatus is affected by the impurities floating in the film formation apparatus. Consequently, when the impurities floating in the film formation apparatus are reduced to the extent that the pressure in the film formation apparatus before the start of film formation is less than about $3.0 \times 10^{-4}$ Pa, the insulation film having a high purity and an arithmetic average surface roughness (Ra) of about 1.0 nm or less is produced.

This is not limited to the electron beam evaporation method as long as it is a vacuum evaporation method, for example, a resistance heating evaporation method and plasma-ion-assisted evaporation method.

Film Formation Method (2) for $Al_2O_3$

Regarding the piezoelectric resonator according to preferred embodiments of the present invention, a film formation method for $Al_2O_3$ different from the Film formation method (1) for $Al_2O_3$ will be described. Explanation will be made with reference numerals based on the piezoelectric resonator shown in FIG. 1.

The $Al_2O_3$ film 7 as the upper layer insulation film is formed on the lower layer insulation film 6 made of $SiO_2$ and arranged on the top surface of the substrate 2 made of a silicon wafer by an electron beam evaporation method at a film thickness growth rate within the range of about 0.6 (nm/sec) to about 1.0 (nm/sec).

The surface roughness of the $Al_2O_3$ film 7 formed by the film formation method is about 0.6 nm on an arithmetic average surface roughness (Ra) basis. The stress in this $Al_2O_3$ film 7 is a tensile stress of about 300 MPa.

Film Formation Method (2) for $SiO_2$

Regarding the piezoelectric resonator according to preferred embodiments of the present invention, a film formation method for $SiO_2$ will be described. In this case, the lower layer of the insulation film is an $Al_2O_3$ film, and a film formation method in which a film of $SiO_2$ is formed on the $Al_2O_3$ film will be explained with reference numerals based on the piezoelectric resonator shown in FIG. 2.

The insulation film 6 primarily including $SiO_2$ is formed by an RF magnetron sputtering method on the lower layer insulation film 7 made of $Al_2O_3$ arranged on the top surface of the substrate 2 made of a silicon wafer. Regarding the condition during this film formation, the gas pressure is preferably within the range of about 0.1 to about 0.25 Pa, and the power density is within the range of about 2.0 $W/cm^2$ to about 8.5 $W/cm^2$. It is very desirable that the gas pressure during film formation is about 0.6 Pa or less.

The surface roughness of the $SiO_2$ film 6 formed by the film formation method is about 0.3 nm on an arithmetic average surface roughness (Ra) basis. The stress in this insulation film 6 of the piezoelectric resonator 1 is a compressive stress of about 150 MPa. When the tensile stress is assumed to be a positive value, this compressive stress has a negative value and, therefore, is about −150 MPa. The stress in the $SiO_2$ film 6 formed as described above is preferably about 250 MPa or less.

When the RF magnetron sputtering method is adopted and the upper layer insulation film of $SiO_2$ is formed, the surface roughness of the surface of the insulation film is about 1.0 nm or less on an arithmetic average surface roughness (Ra) basis, and the stress therein is reduced in the range of about 250 MPa or less on a compressive stress basis. The reasons for this will be described.

Regarding the stress, the relationship between the film formation pressure (pressure of the gas) and the stress has been known. That is, it is a known relationship that when the film formation pressure (pressure of the gas) is increased, the compressive stress is reduced, and when the film formation pressure (pressure of the gas) is reduced, the compressive stress is increased. Therefore, in order to reduce the compressive stress, the film formation pressure (pressure of the gas) is set at a high level. However, when the film formation pressure (pressure of the gas) is set at a high level, the surface roughness of the resulting insulation film becomes coarse and, therefore, it is difficult to allow reduction of surface roughness and reduction of stress to become mutually compatible. This is because when the film formation pressure is high, gases during film formation generate many gaps in the film and, therefore, the surface tends to be roughened. Conversely, when the film formation pressure is reduced, a dense film is formed and the surface tends to become smooth. However, high-speed particles become likely to impinge on the film during film formation due to the reduced film formation pressure and, therefore, a peening effect occurs, in which such a high-speed particle enters into a lattice as an interstitial atom. According to this peening effect, cubical expansion of the film occurs, and a compressive stress is created in the film.

That is, when the gas pressure is high, a scattering probability of the sputtered particles due to the gas is increased and, therefore, the energy of the particle is reduced. Consequently, the influence of the peening effect is reduced and the stress in the insulation film is reduced. On the other hand, it is also known that even when the gas pressure is changed, the film formation rate does not fluctuate to a large degree. Furthermore, it is known that when the RF power is increased during film formation by the RF magnetron sputtering, the film formation rate tends to increase. However, when the film formation rate is increased at the same gas pressure, the peening effect on a unit film thickness basis is reduced. That is, since the peening effect is reduced, the stress created in the film is reduced. In addition, since the quantity of impurities (for example, film formation gas) entrapped in the film is reduced, the dense and smooth insulation film is formed.

Examples of conventional film formation methods for insulation films of $SiO_2$ include a thermal oxidation method, low pressure CVD method, sol-gel process, and evaporation method. However, the stress is increased when film formation is performed by each and every method. For example, the stress is increased to about 300 MPa to about 400 MPa in the case of the thermal oxidation method, and to several hundreds of megapascals in the evaporation method. One of the reasons for the increase of stress in these methods is that the temperature during film formation is high. The temperature is about 300° C. in the sputtering method, whereas the temperature is about 500° C. to about 800° C. in the low pressure CVD method, and is about 1,100° C. in the thermal oxidation method. Therefore, the sputtering method produces less thermal stress. Furthermore, regarding the thermal oxidation method, cubical expansion of the surface of the film due to $O_2$ is brought about and, as a result, the stress is increased. Regarding the sol-gel process, the firing temperature is high and, in addition, variations in the film thickness are likely to occur due to a property specific to this sol-gel process. Consequently, the film surface has poor flatness.

Figure 13:
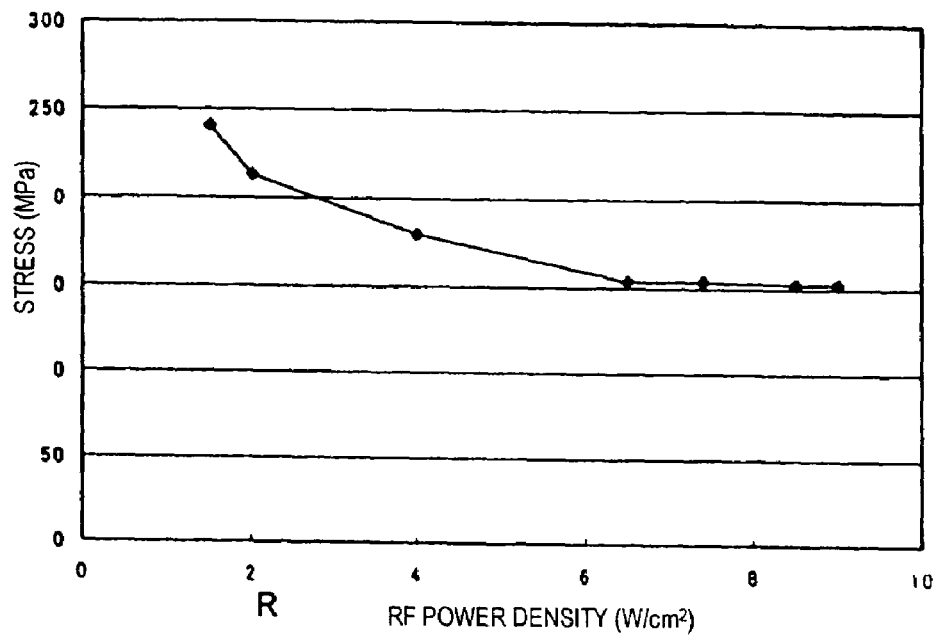
FIG. 13 is a graph showing the relationship between the RF power density and the stress in an insulation film regarding film formation of the insulation film by an RF magnetron sputtering method in a preferred embodiment of the present invention.
Figure 14:
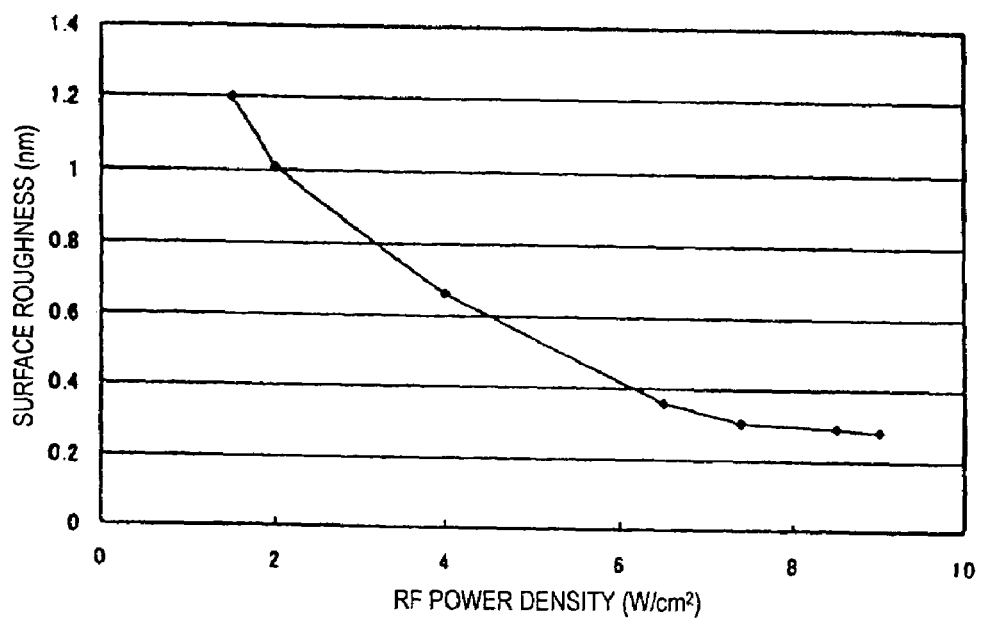
FIG. 14 is a graph showing the relationship between the RF power density and the arithmetic average surface roughness (Ra) of the insulation film surface regarding film formation of the insulation film by an RF magnetron sputtering method in a preferred embodiment of the present invention.

On the other hand, regarding the RF magnetron sputtering method, an insulation film that is subjected to a reduced stress and having an arithmetic average surface roughness of the film surface of about 1.0 nm or less is formed by adjusting the RF power density. Furthermore, when the power of the RF magnetron sputtering is increased, defects in the film are reduced and, therefore, a dense film is produced. As is clear from FIG. 13, when the RF power density indicated by the axis of abscissas is in the vicinity of about 2 (W/cm²), the stress in the insulation film (formed from silicon oxide) indicated by the axis of ordinates exceeds about 200 MPa in some degree, whereas when the RF power density is about 6 (W/cm²) to about 9 (W/cm²) the stress is reduced to close to about 150 MPa. As is clear from FIG. 14, when the RF power density indicated by the axis of abscissas is in the vicinity of about 2 (W/cm²), the arithmetic average surface roughness of the insulation film surface indicated by the axis of ordinates is about 1.0 nm, whereas when the RF power density is in the vicinity of about 8 (W/cm²), the surface roughness is about 0.3 nm. That is, when the RF power density is about 2 (W/cm²) or more, the arithmetic average surface roughness (Ra) of the insulation film surface made of $SiO_2$ is about 1.0 nm or less. On the other hand, when the RF power density is increased to more than about 8.5 (W/cm²), a target becomes likely to crack and, therefore, film formation is adversely affected. Consequently, the RF power density is preferably set to about 8.5 (W/cm²) or less.

As a result, flattening of the surface is increased, entrapment of gas molecules, for example, argon, in the insulation film due to the peening effect is reduced and, therefore, cubical expansion due to the entrapment of gas molecules is reduced. Consequently, the insulation film having a reduced stress is produced.

Figure 15:
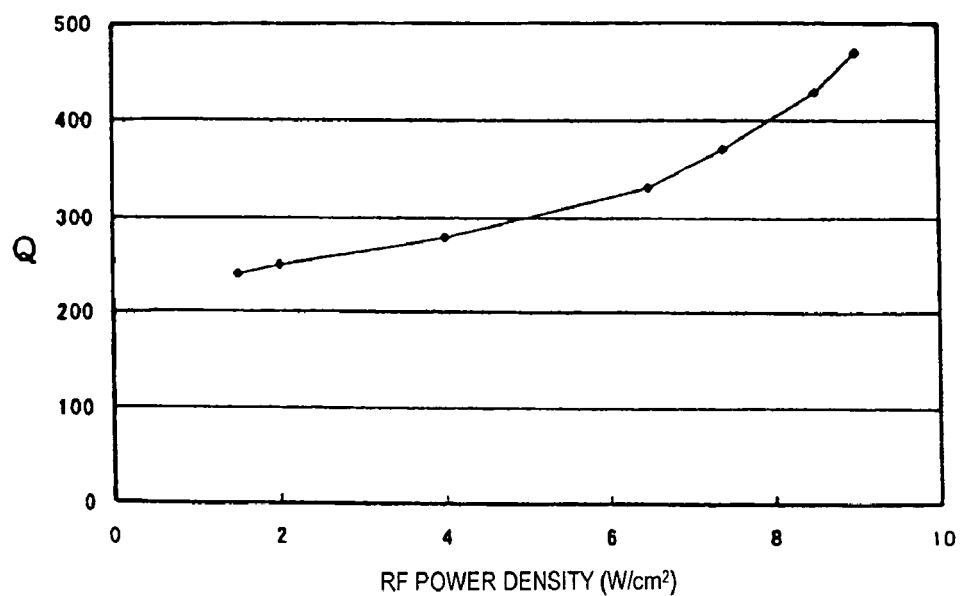
FIG. 15 is a graph showing the relationship between the RF power density and the resonant characteristic Q regarding film formation of the insulation film by an RF magnetron sputtering method in a preferred embodiment of the present invention.

For reference purposes, FIG. 15 shows that the Q as a resonant characteristic is improved with increases in the RF power density.

Next, prevention of oxidation of the lower electrode surface will be described. When a metal, for example, Al that is likely to be oxidized is used for the lower electrode 9, Al is oxidized during film formation of the piezoelectric thin film 10, the surface of the lower electrode 9 becomes aluminum oxide and, therefore, the orientation property of the piezoelectric thin film 10 arranged on the lower electrode 9 is deteriorated. Even when the lower electrode 9 having a small arithmetic average surface roughness (Ra) is formed, degradation of the orientation property of the piezoelectric thin film 10 occurs when the surface of the lower electrode 9 is oxidized. The same is true for the case where Ni, Fe, Mn, Cu, Ti, Mo, W, Ta, or Ag is used for the lower electrode.

Figure 16:
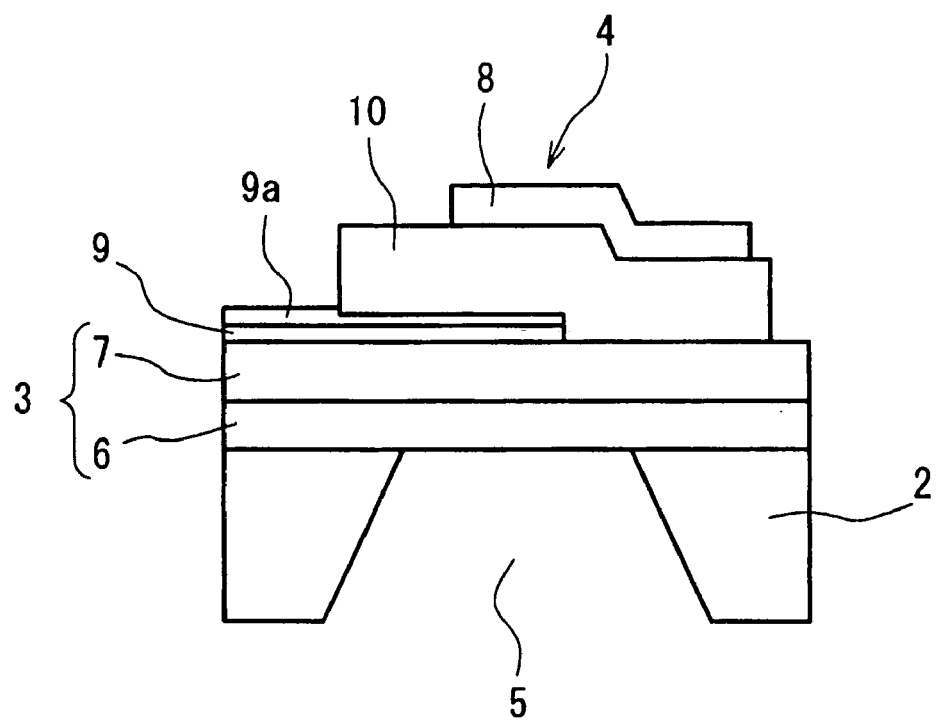
FIG. 16 is a sectional view showing a piezoelectric resonator according to another preferred embodiment of the present invention provided with an anti-oxidation film on a lower electrode.

Then, anti-oxidation film is formed on the lower electrode (refer to FIG. 16). The anti-oxidation film 9a is made of a metal, for example, Au, Ru, Rh, Pd, Os, Ir, and Pt, that is unlikely to oxidize. It is essential that the anti-oxidation film 9a has a thickness that is adequate to prevent oxidation of the lower electrode 9, and the thickness required is about 4 nm to about 30 nm.

The anti-oxidation film 9a is formed on the smooth lower electrode 9 and, therefore, becomes a smooth film similar to the lower electrode 9. Consequently, the piezoelectric thin film 10 arranged on the anti-oxidation film 9a has outstanding orientation properties.

Figure 17:
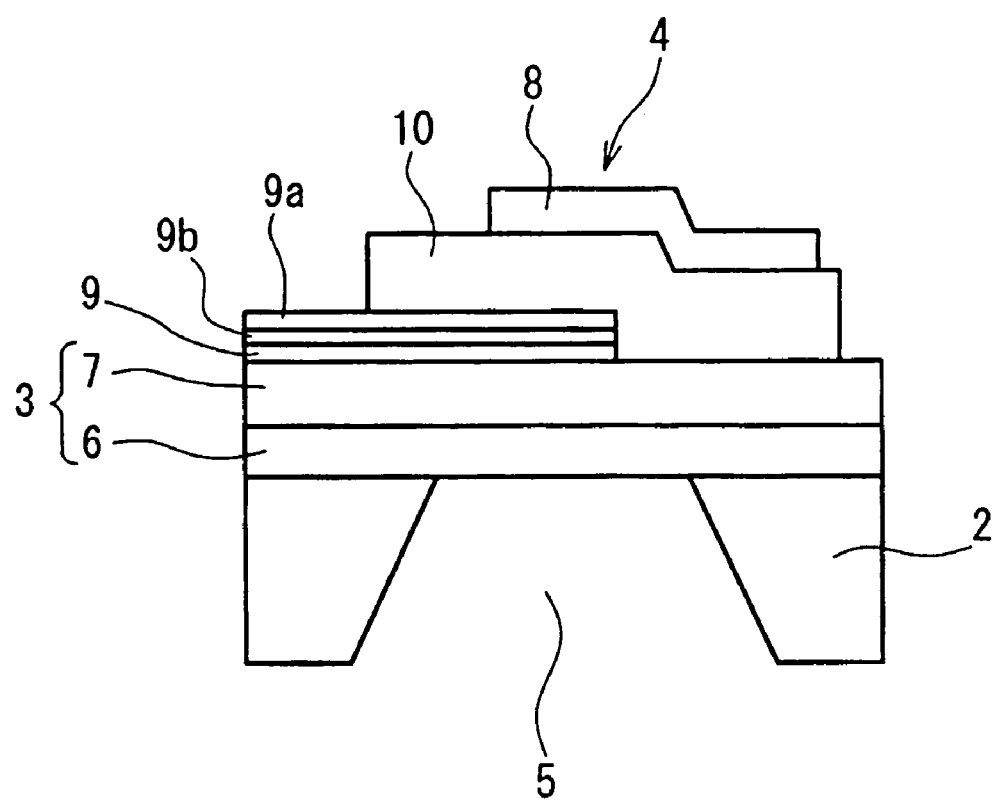
FIG. 17 is a sectional view showing a piezoelectric resonator according to another preferred embodiment of the present invention provided with a diffusion prevention film arranged on a lower electrode and an anti-oxidation film arranged on the diffusion prevention film.

When Al is used for the lower electrode 9 and Au is used for the anti-oxidation film 9a, mutual diffusion occurs between Au and Al and, therefore, the surface of the anti-oxidation film 9a made of Au is not smooth. Consequently, when Al is used for the lower electrode 9 and Au is used for the anti-oxidation film 9a, preferably, a diffusion prevention film 9b is formed between the lower electrode 9 and the anti-oxidation film 9a (refer to FIG. 17). The diffusion prevention film 9b is made of a metal primarily including any one selected from the group consisting of Ag, Ru, Rh, Pd, Os, Ir, Pt, Mo, and Ti, and it is essential that the diffusion prevention film 9b has a thickness that is adequate to prevent mutual diffusion between Au and Al, and the required thickness is about 4 nm to about 30 nm.

Figure 18A:
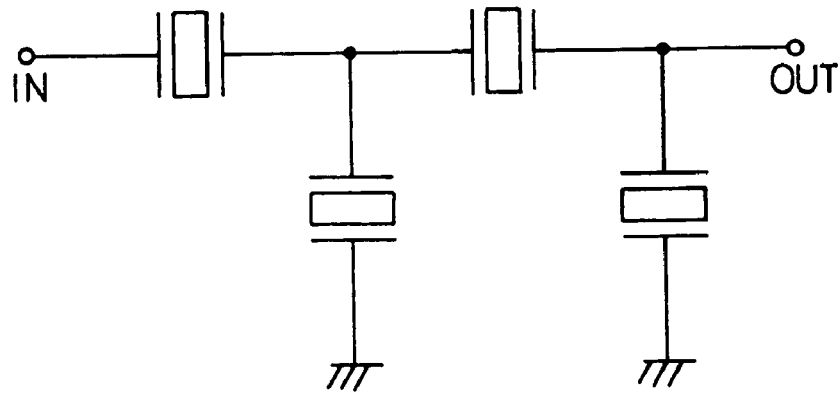
FIGS. 18A to 18C are configurational diagrams of filters using a piezoelectric resonator according to preferred embodiments of the present invention.
Figure 18B:
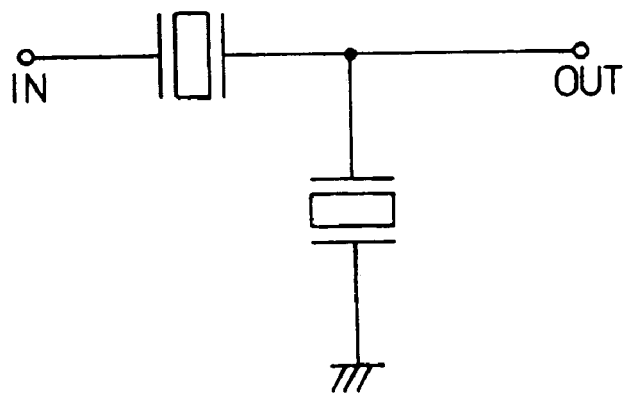
Figure 18C:
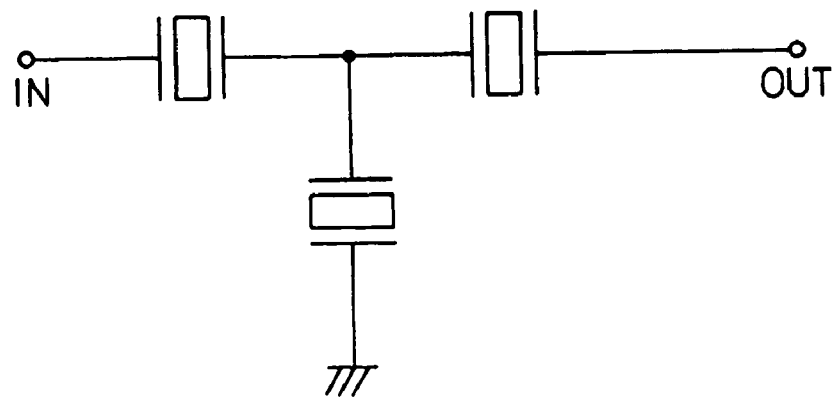

The piezoelectric resonator of various preferred embodiments of the present invention can be incorporated into a π type, L type, and T type ladder filters shown in FIGS. 18A, 18B, and 18C, respectively, and outstanding filter characteristics are achieved.

Figure 19:
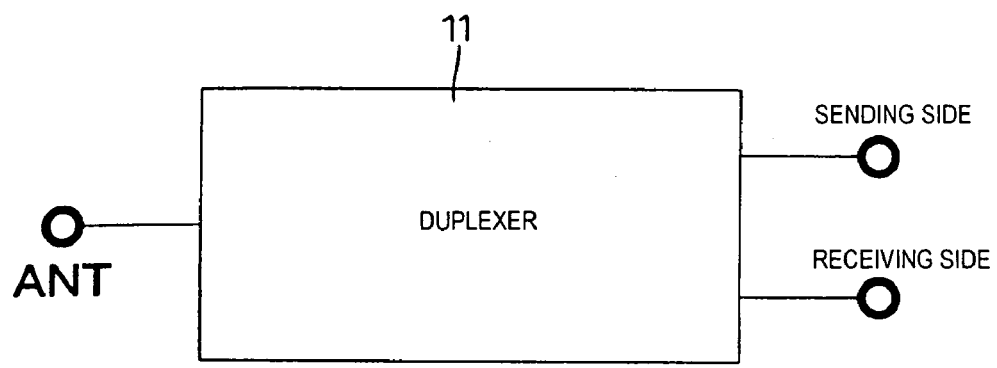
FIG. 19 is a schematic view showing a duplexer using a piezoelectric resonator according to preferred embodiments of the present invention.

The piezoelectric resonator according to preferred embodiments of the present invention may be used for a duplexer 11 as shown in FIG. 19, and furthermore, may be mounted on a cellular phone and other communication apparatuses, and may be used for electronic communication operations such that the operation characteristics thereof are stabilized.

Second Preferred Embodiment

Figure 20:
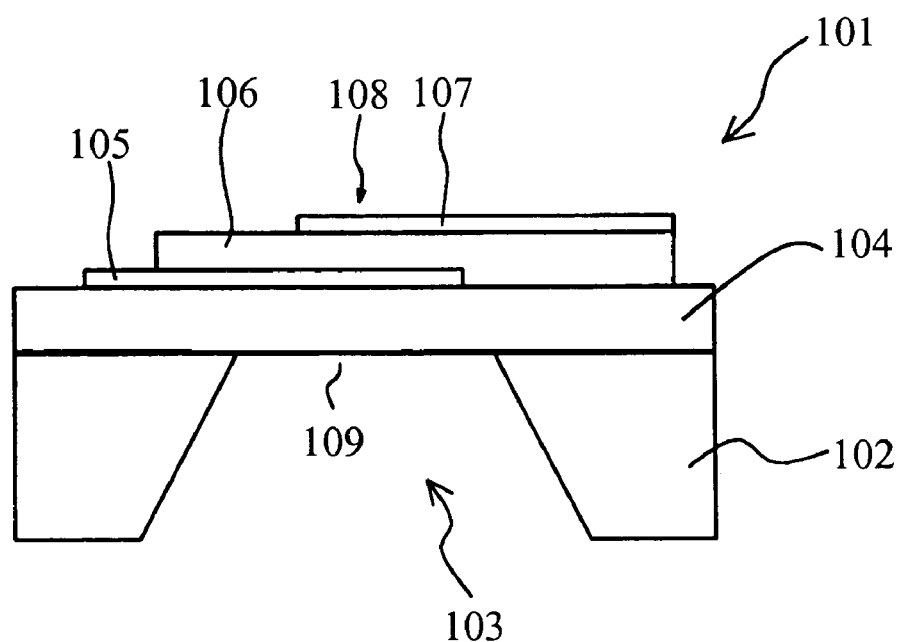
FIG. 20 is a vertical front view showing an example of a piezoelectric resonator according to a preferred embodiment of the present invention.

A piezoelectric resonator according to a second preferred embodiment of the present invention will be described with reference to FIG. 20. This piezoelectric resonator 101 includes a substrate 102, opening 103, insulation film 104, lower electrode 105, piezoelectric thin film 106, and upper electrode 107.

The substrate 102 is made of a semiconductor substrate, for example, a silicon wafer. The opening 103 is formed by, for example, anisotropic etching, with respect to the bottom surface side of the substrate 102. The insulation film 104 is a film which is formed from, for example, silicon oxide ($SiO_2$), on the top surface side of the substrate 102 and which has an electrically insulating property. The lower electrode 105 is a film formed on the insulation film 104 from an appropriate electrode material, for example, aluminum, into a predetermined pattern. The piezoelectric thin film 106 is a piezoelectric film formed on the top surface of a portion of the lower electrode 105 and insulation film 104 from, for example, zinc oxide (ZnO) as a primary component. The upper electrode 107 is a film formed on the piezoelectric thin film 106 from an appropriate electrode material, for example, aluminum, into a predetermined pattern. The lower electrode 105 and the upper electrode 107 are configured to sandwich the piezoelectric thin film 106 in the condition that a portion of them are facing each other in the thickness direction. A piezoelectric vibration portion 108 is defined by the lower electrode 105, upper electrode 107, and piezoelectric thin film 106 as described above.

The piezoelectric vibration portion 108 is configured to vibrate in a thickness longitudinal vibration mode by, for example, a high-frequency electric signal applied to the lower electrode 105 and the upper electrode 107. The insulation film 104 covering the opening 103 defines a diaphragm 109 and supports the piezoelectric vibration portion 108.

Figure 21:
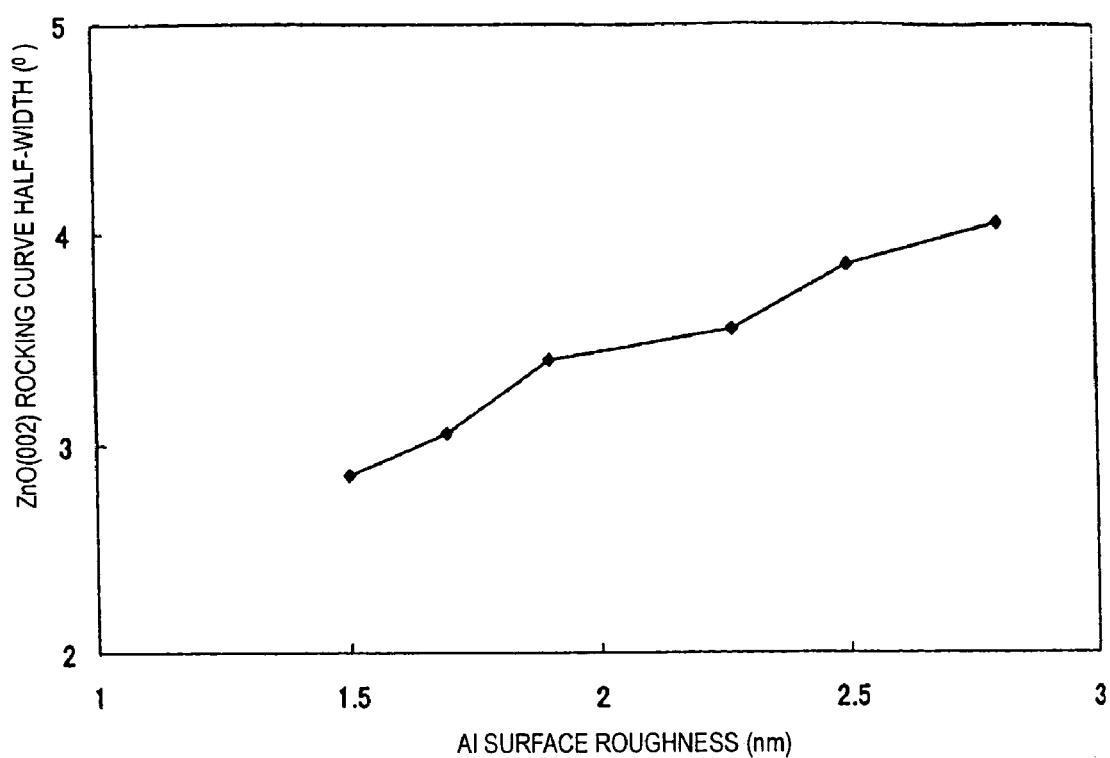
FIG. 21 is a graph showing the relationship between the surface roughness of a lower electrode and the rocking curve half-width of a piezoelectric thin film.
Figure 22:
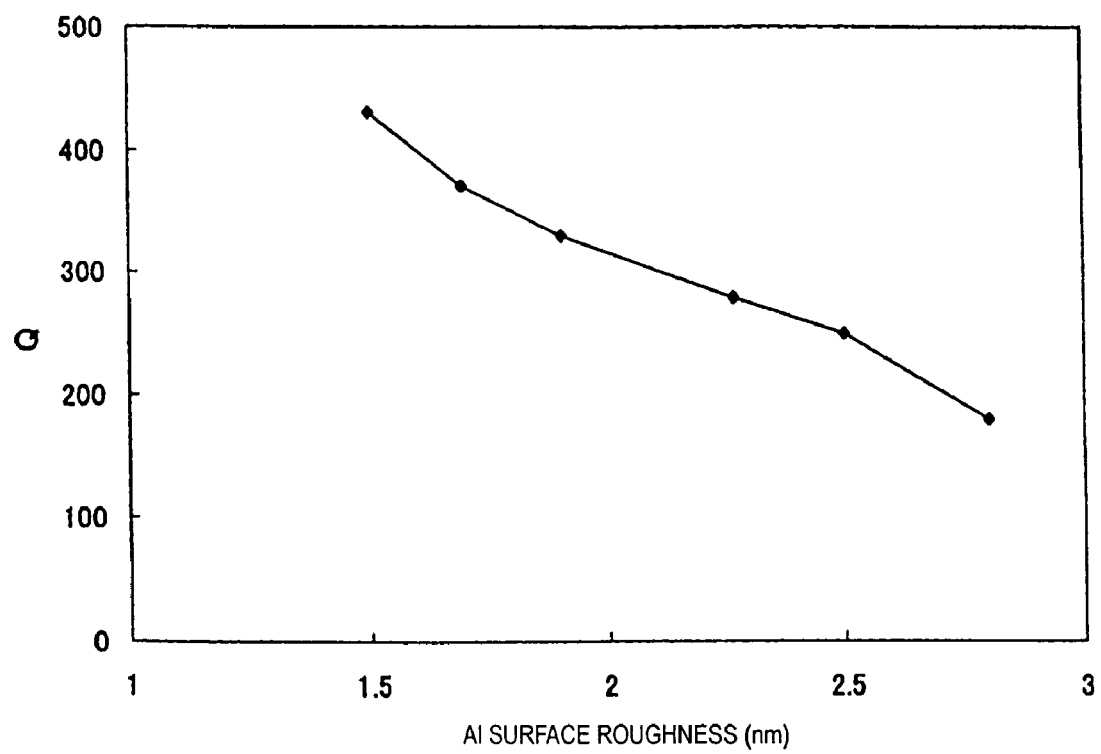
FIG. 22 is a graph showing the relationship between the surface roughness of a lower electrode and the Q.

It is clear from FIG. 21 and FIG. 22 that when the arithmetic average surface roughness (Ra) of the lower electrode is reduced, the orientation property of the piezoelectric film arranged thereon is improved and, therefore, outstanding resonant characteristics are achieved. The Q required for a resonator used for a ladder filter is at least about 200, and as shown in FIG. 22, when the arithmetic average surface roughness (Ra) of the lower electrode is about 2.5 nm or less, the Q of the resonator is about 200 or more. Consequently, in order to produce the resonator having a Q of at least about 200 suitable for defining the ladder filter, the arithmetic average surface roughness (Ra) of the lower electrode must be about 2.5 nm or less.

Figure 23:
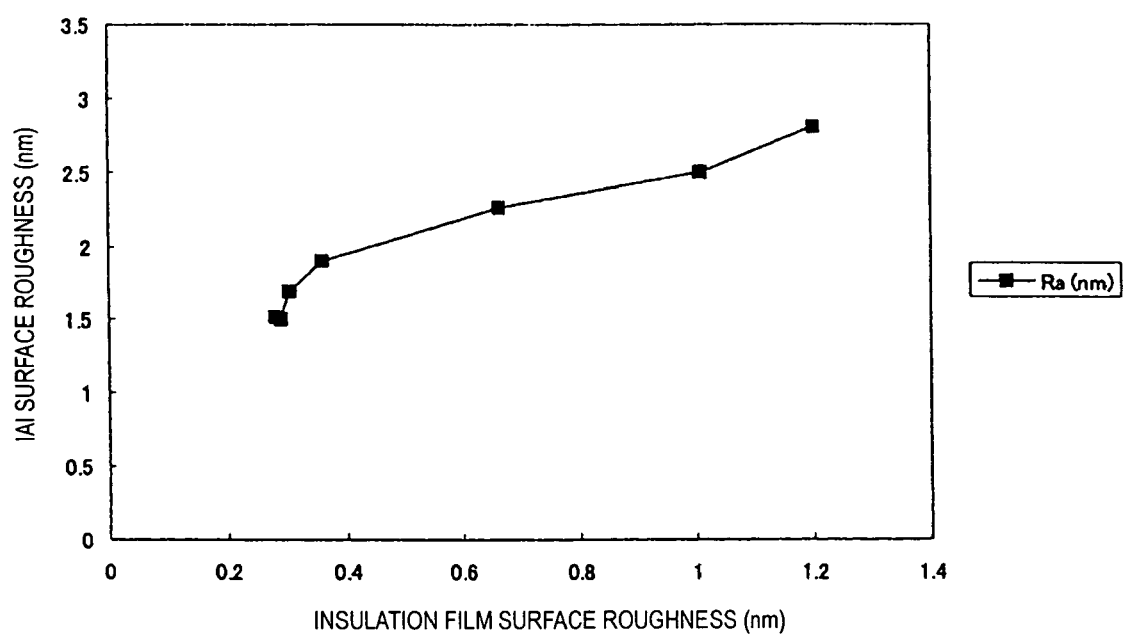
FIG. 23 is a graph showing the relationship between the surface roughness of an insulation film and the surface roughness of a lower electrode.

In order to form the lower electrode having an arithmetic average surface roughness (Ra) of about 2.5 nm or less, the arithmetic average surface roughness (Ra) of an insulation film defining a substrate thereof must be small. As is clearly shown in FIG. 23, when the arithmetic average surface roughness (Ra) of the insulation film is about 1.0 nm or less, the arithmetic average surface roughness (Ra) of the lower electrode arranged thereon is about 2.5 nm or less.

That is, by setting the arithmetic average surface roughness (Ra) of the insulation film to be about 1.0 nm or less, the lower electrode having an arithmetic average surface roughness (Ra) of about 2.5 nm or less is produced, the piezoelectric thin film having high orientation properties is produced and, by extension, the resonator having a Q of at least about 200 suitable for defining the ladder filter is produced.

Figure 24A:
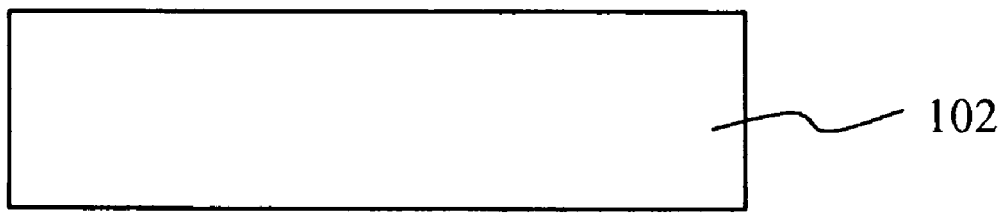
FIGS. 24A to 24F are vertical front views showing manufacturing steps of the piezoelectric resonator shown in FIG. 1.
Figure 24B:
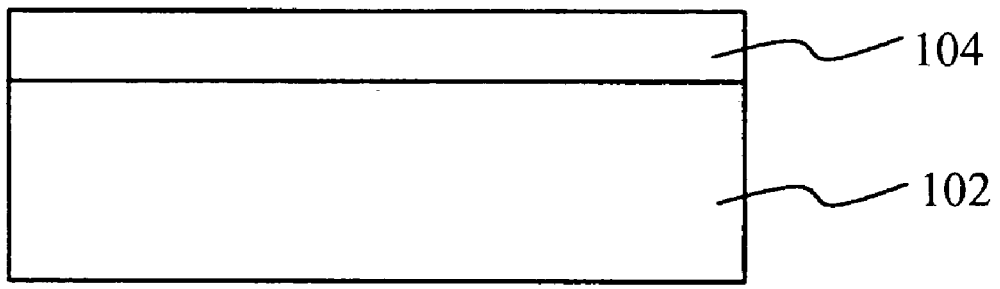
Figure 24C:
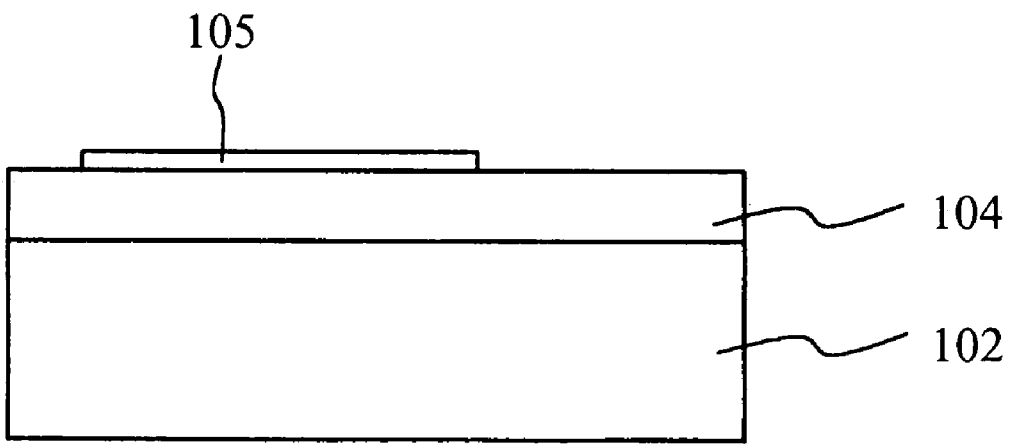

A method for manufacturing the piezoelectric resonator 101 will be described with reference to FIGS. 24A to 24F. Initially, as shown in FIG. 24A, the substrate 2 made of a silicon wafer is prepared. Subsequently, as shown in FIG. 24B, the insulation film 104 primarily including silicon oxide ($SiO_2$) is formed on the substrate 102 by an RF magnetron sputtering method. This film formation step is the first step in the method for manufacturing the piezoelectric resonator including the insulation film primarily including silicon oxide. Regarding the condition during this film formation, the gas pressure is about 0.1 Pa to about 0.25 Pa, and the power density is about 2.0 W/cm$^2$ to about 8.5 W/cm$^2$. Subsequently, as shown in FIG. 24C, a photoresist is patterned on the insulation film 104 by photolithography, and a film of the lower electrode 105 made of aluminum is formed by evaporation, sputtering, or other suitable method, from above this photoresist. After this film formation, the photoresist is lifted off. The pressure during film formation of the insulation film 104 is preferably about 0.1 Pa to about 0.25 Pa as described above. However, it is preferably about 0.6 Pa or less.

Figure 24D:
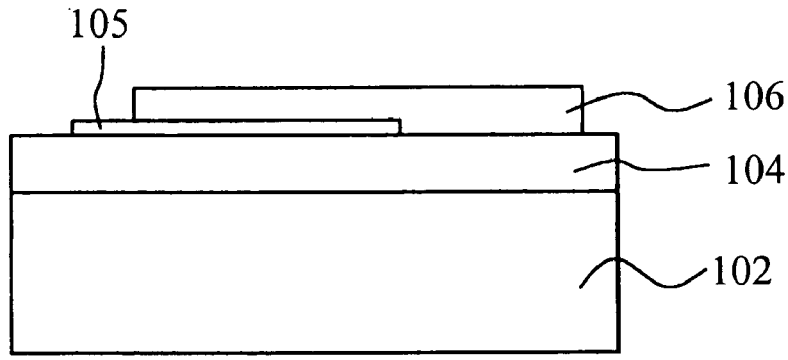
Figure 24E:
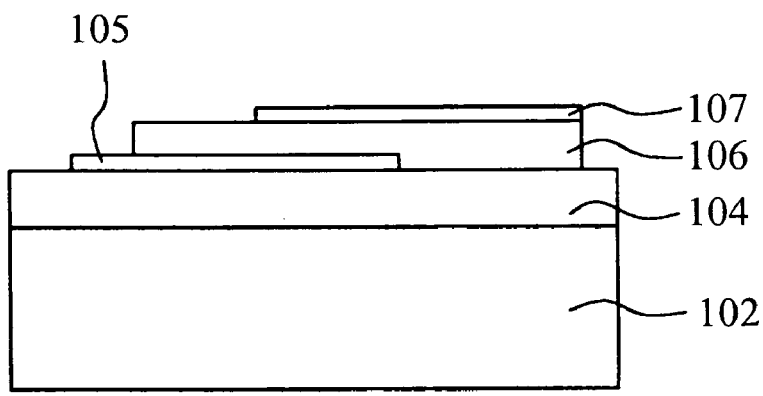
Figure 24F:
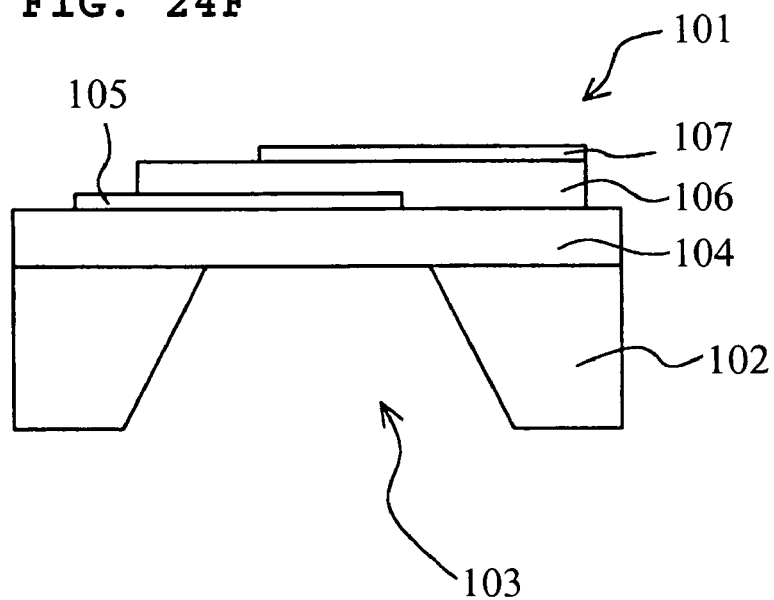

Next, as shown in FIG. 24D, the piezoelectric thin film 106 primarily including zinc oxide (ZnO) is formed in the desired range on the insulation film 104 and the lower electrode 105 by sputtering while masking is performed with a metal mask, although not shown in the drawing. This film formation step is the second step in the method for manufacturing the piezoelectric resonator including the insulation film primarily including silicon oxide. Subsequently, as shown in FIG. 24E, a photoresist is patterned on the piezoelectric thin film 106 by photolithography, and a film of the upper electrode 107 made of aluminum (Al) is formed while facing a portion of the lower electrode 105 in the thickness direction by evaporation, sputtering, or other suitable method, from above this photoresist. Subsequently, films of electrode pads, although not shown in the drawing, are formed and, thereafter, the photoresist is lifted off.

Finally, as shown in FIG. 24E, the opening 103 is formed by performing an anisotropic etching treatment with respect to the back side of the substrate 102. In this case, the opening 103 is formed such that the top surface of the opening 103 extends to the insulation film 104.

The manufacturing step of the piezoelectric resonator according to preferred embodiments of the present invention is completed through each of the steps.

The surface roughness of the insulation film 104 of the piezoelectric resonator 101 manufactured through the steps is preferably about 0.3 nm on an arithmetic average surface roughness (Ra) basis. The stress in this insulation film 104 of the piezoelectric resonator 101 is a compressive stress of about 150 MPa. When the tensile stress is a positive value, this compressive stress shows a negative value and, therefore, is about −150 MPa.

When the RF magnetron sputtering method is adopted and the insulation film made of $SiO_2$ is formed, the surface roughness of the surface of the insulation film is about 1.0 nm or less on an arithmetic average surface roughness (Ra) basis, and the stress is reduced such that the stress is within the range of about 250 MPa or less on a compressive stress basis. The reasons for this will be described below.

Regarding the stress, the relationship between the film formation pressure (pressure of the gas) and the stress is known. That is, it is a known relationship that when the film formation pressure (pressure of the gas) is increased, the compressive stress is reduced, and when the film formation pressure (pressure of the gas) is reduced, the compressive stress is increased. Therefore, in order to reduce the compressive stress, the film formation pressure (pressure of the gas) is set at a high level. However, when the film formation pressure (pressure of the gas) is set at a high level, the surface roughness of the resulting insulation film increases and, therefore, it is difficult to reduce the surface roughness and reduce of stress to be mutually compatible. This is because when the film formation pressure is high, gases during the film formation generate many gaps in the film and, therefore, the surface is roughened. Conversely, when the film formation pressure is reduced, a dense film is formed and the surface becomes smooth. However, high-speed particles are likely to impinge on the film during the film formation due to the reduced film formation pressure and, therefore, a peening effect occurs, in which such a high-speed particle enters into a lattice as an interstitial atom. According to this peening effect, cubical expansion of the film occurs, and a compressive stress is created in the film.

That is, when the gas pressure is high, a scattering probability of the sputtered particles due to the gas is increased and, therefore, the energy of the particle is reduced. Consequently, the influence of the peening effect is reduced and the stress in the insulation film is reduced. On the other hand, it is also known that even when the gas pressure is changed, the film formation rate does not fluctuate substantially. Furthermore, it is known that when the RF power is increased during film formation by the RF magnetron sputtering, the film formation rate increases. However, when the film formation rate is increased at the same gas pressure, the peening effect on a unit film thickness basis is reduced. That is, since the peening effect is reduced, the stress created in the film is reduced. In addition, since the quantity of impurities (for example, film formation gas) entrapped in the film is reduced, a dense and smooth insulation film is produced.

Examples of conventional film formation methods for insulation films of silicon oxide include a thermal oxidation method, low pressure CVD method, sol-gel process, and evaporation method. However, the stress is increased when film formation is performed by each and every method. For example, the stress is increased to about 300 MPa to about 400 MPa in the case of the thermal oxidation method, and to several hundreds of megapascals in the evaporation method. One of the reasons for the increase of stress in these methods is that the temperature during film formation is high. The temperature is about 300° C. in the sputtering method, whereas the temperature is about 500° C. to about 800° C. in the low pressure CVD method, and is about 1,100° C. in the thermal oxidation method and, therefore, the sputtering method produces less thermal stress. Furthermore, regarding the thermal oxidation method, cubical expansion of the surface of the film due to $O_2$ is produced and, as a result, the stress is increased. Regarding the sol-gel process, the firing temperature is high and, in addition, variations in the film thickness occur due to a property specific to this sol-gel process. Consequently, the film surface has reduced flatness.

Figure 25:
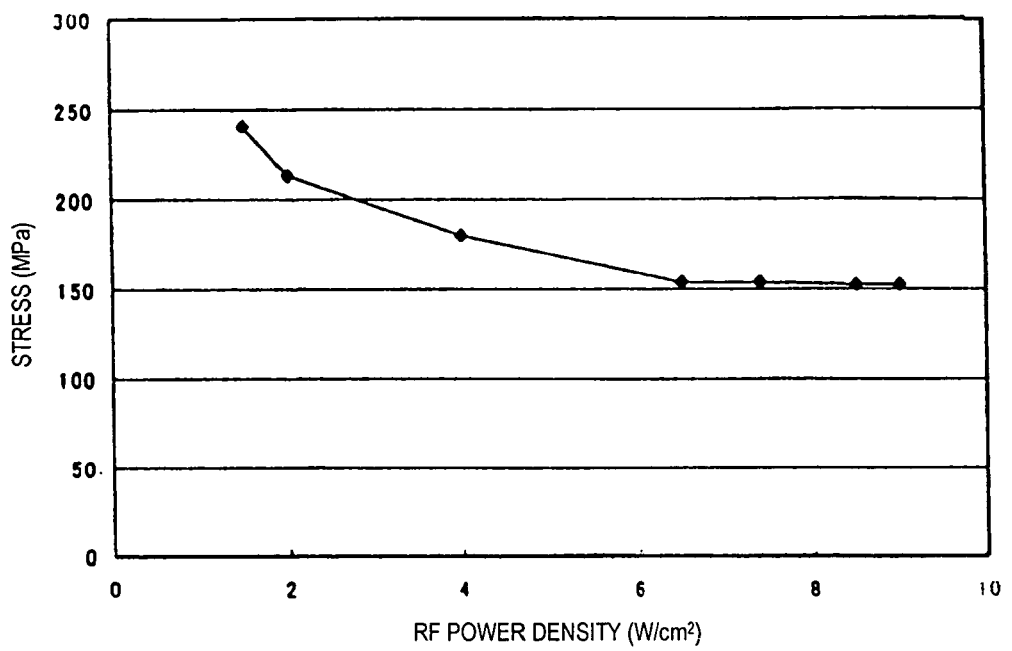
FIG. 25 is a graph showing the relationship between the RF power density and the compressive stress in an insulation film regarding film formation of the insulation film by an RF magnetron sputtering method.
Figure 26:
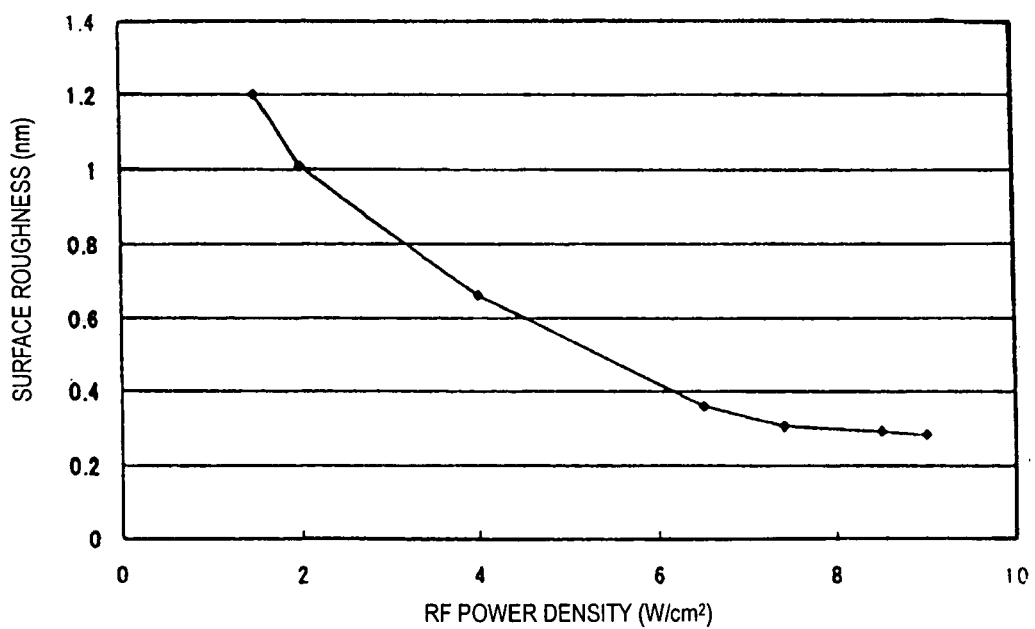
FIG. 26 is a graph showing the relationship between the RF power density and the arithmetic average surface roughness (Ra) of the insulation film surface regarding film formation of the insulation film by an RF magnetron sputtering method.

On the other hand, regarding the RF magnetron sputtering method, the insulation film subject to a reduced stress and having an arithmetic average surface roughness of the film surface of about 1.0 nm or less is formed by adjusting the RF power density. Furthermore, when the power of the RF magnetron sputtering is increased, defects in the film are reduced and, therefore, the dense film is produced. As is clear from FIG. 25, when the RF power density indicated by the axis of abscissas is in the vicinity of about 2 (W/cm$^2$), the compressive stress of the insulation film (formed from silicon oxide) indicated by the axis of ordinates exceeds 200 MPa, whereas when the RF power density is about 6 (W/cm$^2$) to about 9 (W/cm$^2$), the compressive stress is reduced to about 150 MPa. As is clear from FIG. 26, when the RF power density indicated by the axis of abscissas is in the vicinity of about 2 (W/cm$^2$), the arithmetic average surface roughness of the insulation film surface indicated by the axis of ordinates is about 1.0 nm, whereas when the RF power density is in the vicinity of 8 (W/cm$^2$), the surface roughness is about 0.3 nm. That is, when the RF power density is about 2 (W/cm$^2$) or more, the arithmetic average surface roughness (Ra) of the insulation film surface is about 1.0 nm or less. On the other hand, when the RF power density is increased to more than about 8.5 (W/cm$^2$), a target is likely to crack and, therefore, film formation is adversely affected. Consequently, the RF power density is preferably set to about 8.5 (W/cm$^2$) or less.

As a result, the flatness of the surface is increased, entrapment of gas molecules, for example, argon, into the insulation film due to the peening effect is reduced and, therefore, cubical expansion due to the entrapment of gas molecules is reduced. Consequently, the insulation film subject to a reduced stress is produced.

Figure 27:
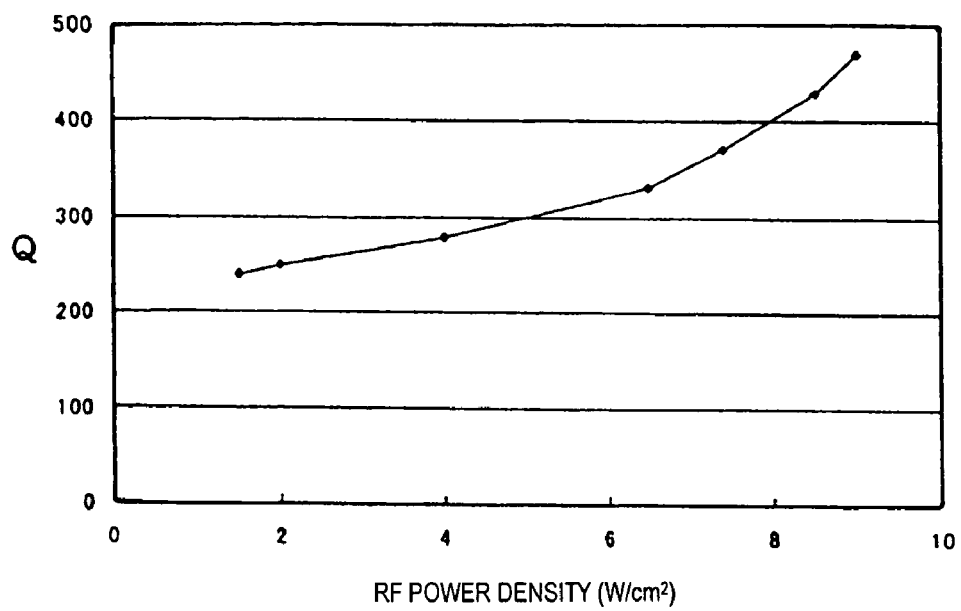
FIG. 27 is a graph showing the relationship between the RF power density and the resonant characteristic Q regarding film formation of the insulation film by an RF magnetron sputtering method.
Figure 28:
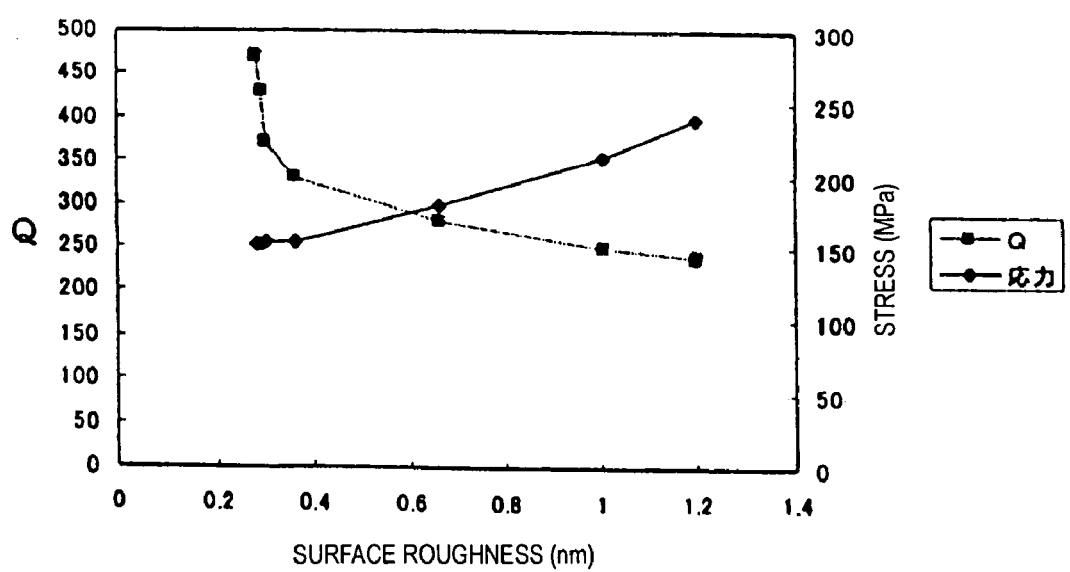
FIG. 28 is a graph showing the relationship between the arithmetic average surface roughness (Ra) of the insulation film surface formed by an RF magnetron sputtering method and the resonant characteristic Q and, in addition, the stress in the insulation film.

For reference purposes, FIG. 27 shows that the Q as a resonant characteristic is improved with increases in the RF power density. FIG. 28 shows that the Q as a resonant characteristic is improved and the stress in the insulation film is reduced with decreases in the surface roughness.

In the case where the insulation film is a layer of silicon oxide ($SiO_2$) and the piezoelectric thin film of zinc oxide (ZnO) is laminated on the insulation film as in the second preferred embodiment, since both of the insulation film and the piezoelectric thin film have a compressive stress, the stress in the diaphragm 109 and the total piezoelectric vibration portion 108 is reduced when the stress in the insulation film is reduced.

Third Preferred Embodiment

Figure 29:
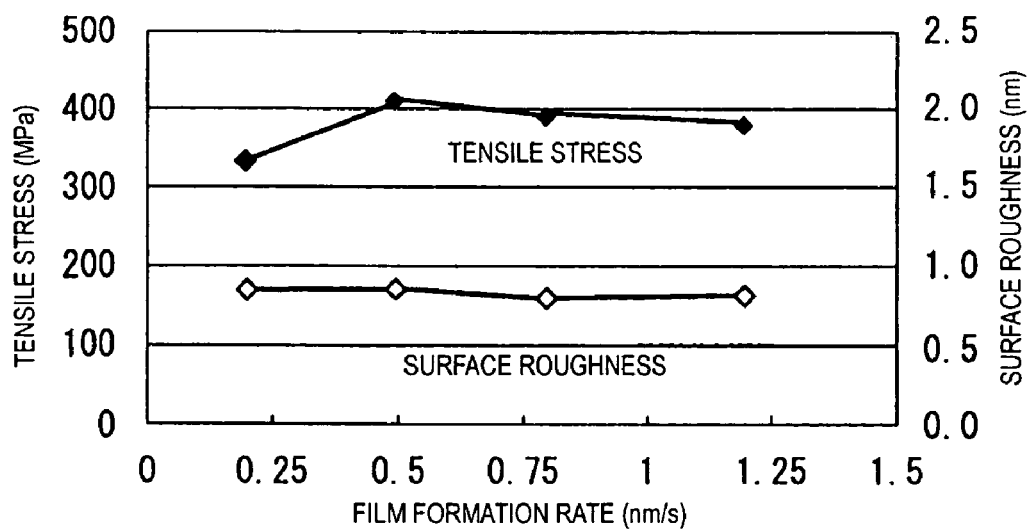
FIG. 29 is a graph showing the relationship between the film formation rate and the tensile stress and the relationship between the film formation rate and the surface roughness in a preferred embodiment according to the present invention.

The third preferred embodiment of the present invention will be described with reference to FIG. 29 to FIG. 31.

The inventors of the present invention performed research regarding a film formation method for the insulation film of $Al_2O_3$ having an arithmetic average surface roughness (Ra) of about 1.0 nm or less. In order to investigate the relationship between the film formation rate (film thickness growth rate) and the stress and surface roughness of the resulting insulation film, films were formed by an electron beam evaporation method while only the individual film formation rates were differentiated and other condition were not substantially changed and, thereby, the results as shown in FIG. 29 were obtained. As is clear from FIG. 29, it was verified that the film formation rate does not substantially affect the stress and surface roughness of the resulting insulation film.

Figure 30:
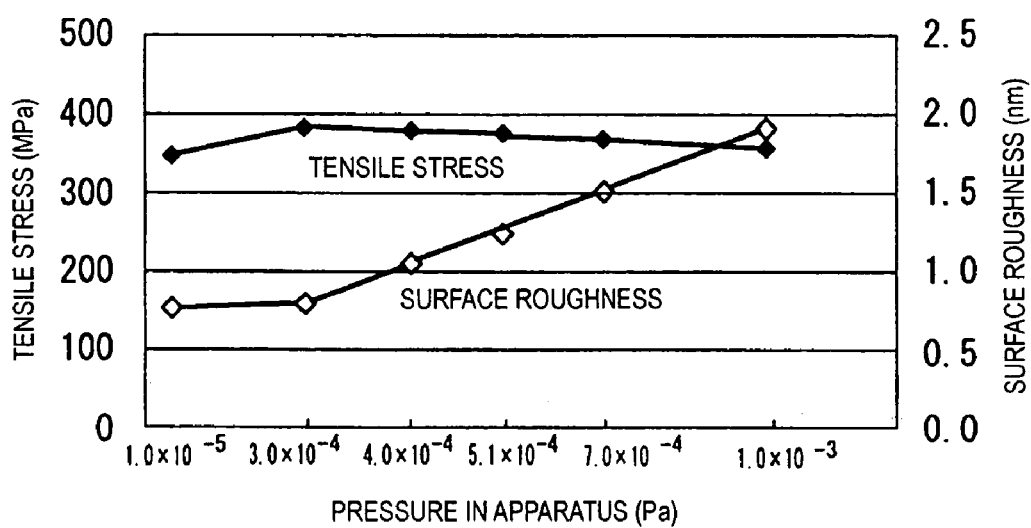
FIG. 30 is a graph showing the relationship between the degree of vacuum in an apparatus and the tensile stress and the relationship between the film formation rate and the surface roughness in a preferred embodiment according to the present invention.

Next, films were formed by the same electron beam evaporation method while only the individual pressures in the film formation apparatus before the start of film formation were differentiated and other conditions were not substantially changed, for example, all of the film formation rates were about 0.8 nm/sec, and thereby, the results as shown in FIG. 30 were obtained. As is clearly shown in FIG. 30, when the film formation was performed while the pressure in the film formation apparatus before start of film formation was less than about $3.0 \times 10^{-4}$ Pa, the insulation film having an arithmetic average surface roughness (Ra) of about 1.0 nm or less was produced.

It is considered that this result is brought about by the purity of the film formed. Regarding particles of $Al_2O_3$ heated and vaporized in a crucible, the purity reaches a maximum value and the particle size reaches a minimum value immediately after flying from the crucible. However, when floating impurities are present in the film formation apparatus, the particles of $Al_2O_3$ may chemically react with the particles of the impurities before the particles of $Al_2O_3$ reach the substrate and, as a result, the purity of the resulting film is reduced. Accompanying that, the particle size becomes greater than that at the time of vaporization, and a coarse film, that is, a film having a large arithmetic average surface roughness (Ra) is produced. Consequently, it is necessary to reduce impurities floating in the film formation apparatus. The pressure in the film formation apparatus is affected by the impurities floating in the film formation apparatus. Since the ratio of impurities floating in the film formation apparatus is reduced with a decrease in the pressure in the film formation apparatus, when the impurities floating in the film formation apparatus are reduced to the degree that the pressure in the film formation apparatus before the start of film formation is less than about $3.0 \times 10^{-4}$ Pa, the insulation film having a high purity and an arithmetic average surface roughness (Ra) of about 1.0 nm or less is produced.

This is not limited to the electron beam evaporation method as long as it is a vacuum evaporation method, for example, a resistance heating evaporation method and plasma-ion-assisted evaporation method.

Figure 31:
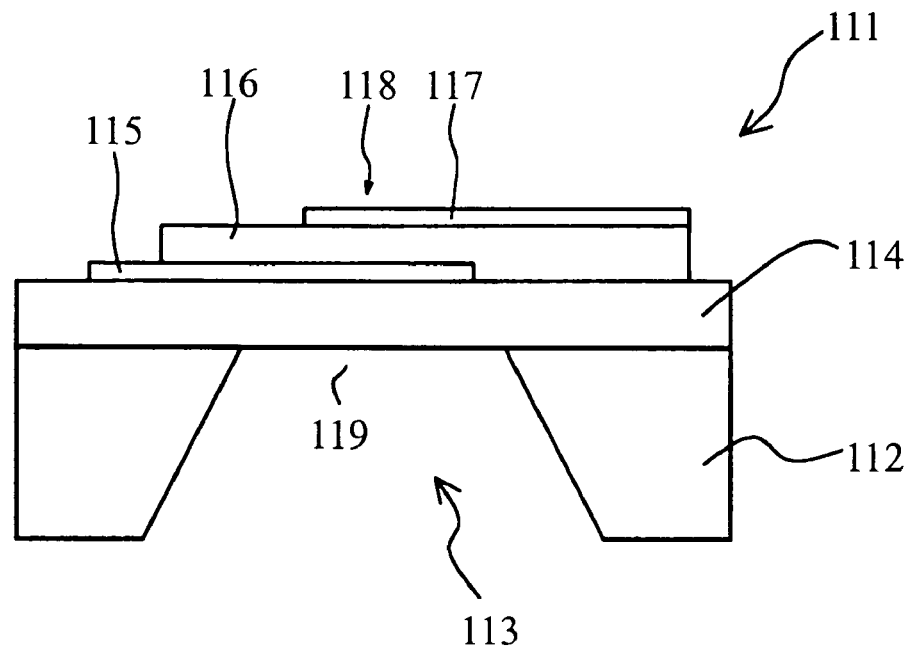
FIG. 31 is a vertical front view showing another preferred embodiment of a piezoelectric resonator according to the present invention.
Figure 32:
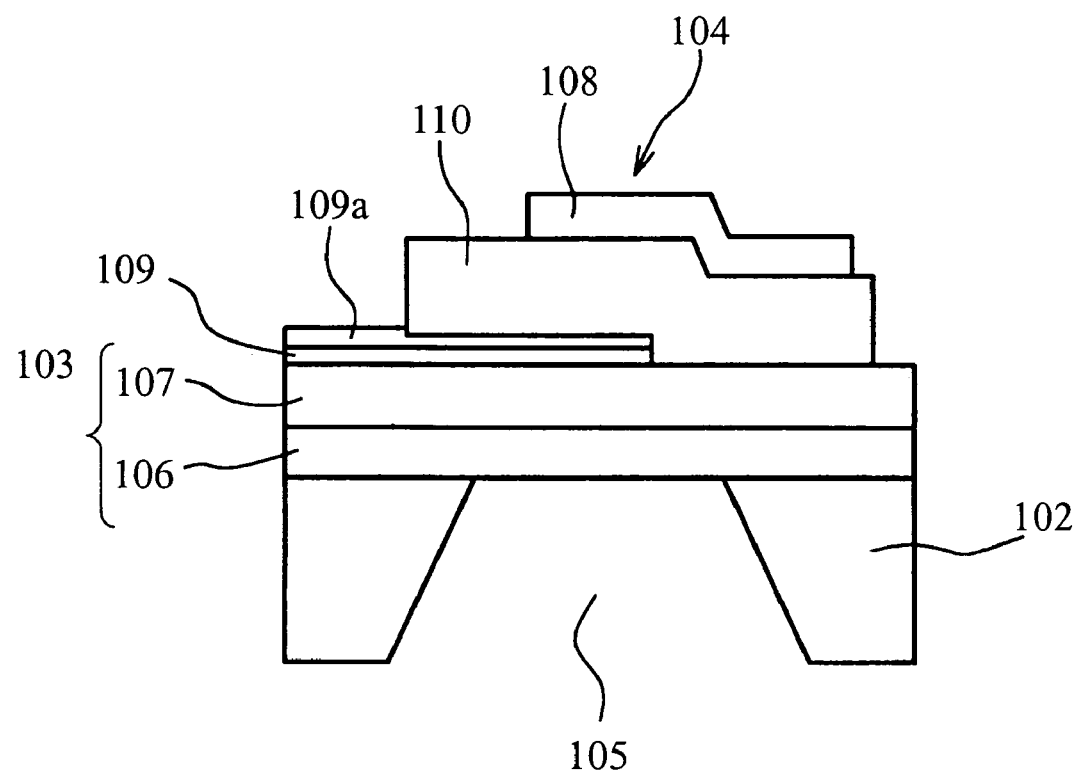
FIG. 32 is a sectional view showing a piezoelectric resonator according to another preferred embodiment of the present invention provided with an anti-oxidation film on a lower electrode.

An example of the piezoelectric resonator including an insulation film primarily including aluminum oxide is shown in FIG. 31. FIG. 31 is a vertical front view showing the structure of a piezoelectric resonator. In this piezoelectric resonator 111, an insulation film 114 made of aluminum oxide ($Al_2O_3$), a lower electrode 115 made of aluminum, a piezoelectric thin film 116 primarily including zinc oxide (ZnO), and an upper electrode 117 made of aluminum are arranged sequentially on a silicon substrate 112. The lower electrode 115 and the upper electrode 117 are arranged to sandwich the piezoelectric thin film 116 such that a portion of the lower electrode 115 and the upper electrode 117 are facing each other in the thickness direction. A piezoelectric vibration portion 118 is defined by the sandwiched portion of this piezoelectric thin film 116 and the lower electrode 115 and upper electrode 117 sandwiching it. This piezoelectric vibration portion 118 is configured to vibrate in a thickness longitudinal vibration mode by an electric signal through the lower electrode 115 and the upper electrode 117. An opening 113 is arranged underneath the piezoelectric vibration portion 118 by anisotropic etching or reactive ion etching. A portion of the insulation film 114 covering the opening 113 defines a diaphragm 119 supporting this piezoelectric vibration portion 118 such that the piezoelectric vibration portion 118 can vibrate.

Next, a method for manufacturing this piezoelectric resonator 111 will be briefly described step by step.

The substrate 112 made of a silicon wafer is prepared. The insulation film 114 is formed on the substrate 112 by an electron beam evaporation method at a film thickness growth rate within the range of about 0.6 (nm/sec) to about 1.0 (nm/sec). This film formation step is the first step in the method for manufacturing the piezoelectric resonator including the insulation film primarily containing aluminum oxide. The lower electrode 115 made of aluminum (Al) is formed on this insulation film 114 by a lift-off evaporation method, or other suitable method. After this film formation, a photoresist is lifted off. The piezoelectric thin film 116 primarily including zinc oxide (ZnO) is formed in a predetermined region on the insulation film 114 and the lower electrode 115 by reactive sputtering while masking is performed with a metal mask, although not shown in the drawing. This film formation step is the second step in the method for manufacturing the piezoelectric resonator including the insulation film primarily containing aluminum oxide. A film of the upper electrode 117 made of aluminum (Al) is formed on the piezoelectric thin film 116, while facing a portion of the lower electrode 115 in the thickness direction by evaporation, sputtering, or other suitable method. Subsequently, films of electrode pads, although not shown in the drawing, are formed and, thereafter, the photoresist is lifted off. The opening 113 is formed by performing an anisotropic etching treatment on the back surface of the substrate 112. In this case, the opening 113 is formed such that the ceiling surface of the opening 113 extends to the insulation film 114.

The surface roughness of the insulation film 114 of the piezoelectric resonator 111 manufactured by the steps is about 0.6 nm on an arithmetic average surface roughness (Ra) basis. The stress in this insulation film 114 of the piezoelectric resonator 111 is a tensile stress of at least about 300 MPa.

Regarding the piezoelectric resonator of the present preferred embodiment, since aluminum oxide has a tensile stress in contrast to zinc oxide, the stress of the total element is reduced, the element is unlikely to break and, therefore, reliability is improved. The resonant characteristics of the laminated electrode films, piezoelectric thin film, and piezoelectric resonator are improved.

In the case where the insulation film is a layer of aluminum oxide ($Al_2O_3$) and the piezoelectric thin film of zinc oxide (ZnO) is laminated on the insulation film as in the third preferred embodiment, since the insulation film has a tensile stress and the piezoelectric thin film has a compressive stress, these stresses are adjusted to cancel each other, the stress in the diaphragm 109 and the total piezoelectric vibration portion 118 is greatly reduced.

When a metal, for example, Al, likely to be oxidized is used for the lower electrode, Al is oxidized during film formation of the piezoelectric thin film, the surface of the lower electrode becomes aluminum oxide and, therefore, the orientation property of the piezoelectric thin film arranged on the lower electrode is deteriorated. Even when the lower electrode having a small arithmetic average surface roughness (Ra) is formed, degradation of the orientation property of the piezoelectric thin film occurs when the surface of the lower electrode is oxidized. The same is true for the case where the lower electrode made of a metal primarily containing Ni, Fe, Mn, Cu, Ti, Mo, W, Ta, or Ag other than Al.

Then an anti-oxidation film is formed on the lower electrode (refer to FIG. 114). The anti-oxidation film is made of a metal primarily including, for example, Au, Ru, Rh, Pd, Os, Ir, and Pt, that is unlikely to oxidize. It is essential that the antioxidation film has a thickness adequate to prevent oxidation of the lower electrode, and the thickness required is about 4 nm to about 30 nm.

The anti-oxidation film is formed on the smooth lower electrode and, therefore, becomes a smooth film similar to the lower electrode. Consequently, the piezoelectric thin film arranged on the anti-oxidation film has outstanding orientation property.

Figure 33:
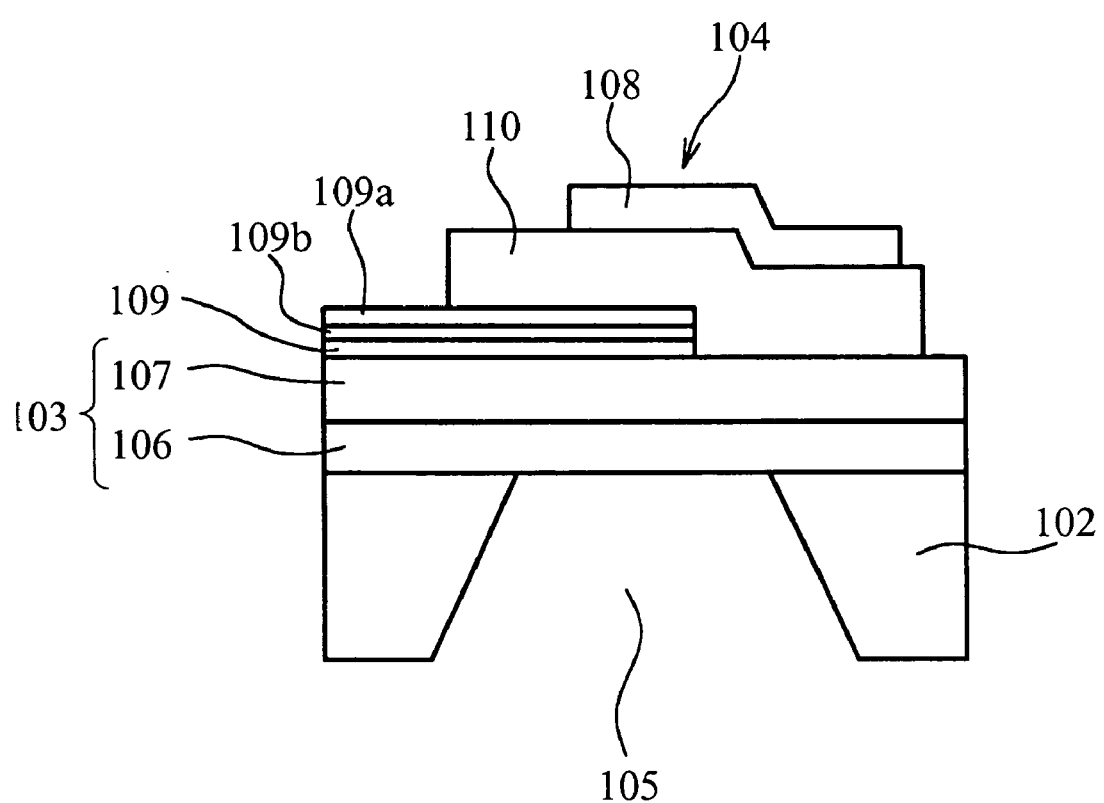
FIG. 33 is a sectional view showing a piezoelectric resonator according to another preferred embodiment of the present invention provided with a diffusion prevention film arranged on a lower electrode and an anti-oxidation film arranged on the diffusion prevention film.

When Al is used for the lower electrode and Au is used for the anti-oxidation film, mutual diffusion occurs between Au and Al and, therefore, the surface of the anti-oxidation film made of Au is not smooth. Consequently, when Al is used for the lower electrode and Au is used for the anti-oxidation film, preferably, a diffusion prevention film is formed between the lower electrode and the anti-oxidation film (refer to FIG. 33). The diffusion prevention film is made of a metal primarily including any one selected from the group consisting of Ag, Ru, Rh, Pd, Os, Ir, Pt, Mo, and Ti, and it is essential that the diffusion prevention film has a thickness adequate to prevent mutual diffusion between Au and Al, and the required thickness is about 4 nm to about 30 nm.

Fourth Preferred Embodiment

Figure 34:
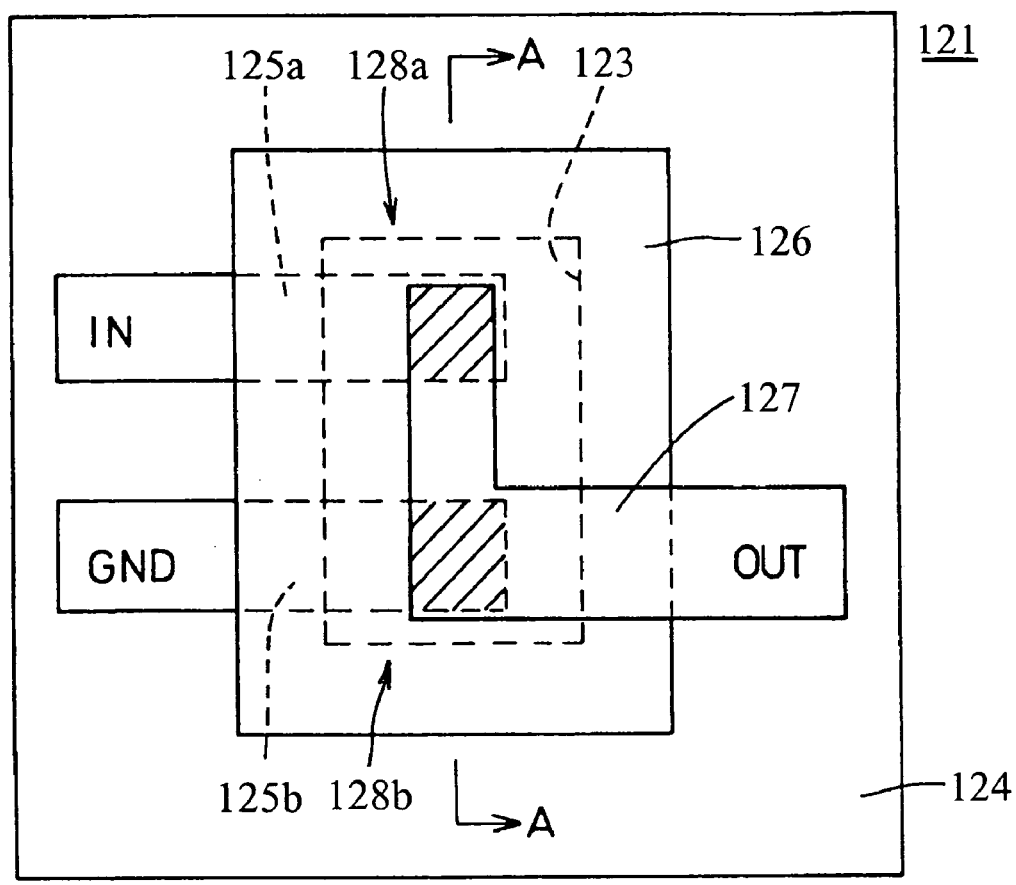
FIG. 34 is a schematic plan view showing an example of a piezoelectric filter according to preferred embodiments of the present invention.
Figure 35:
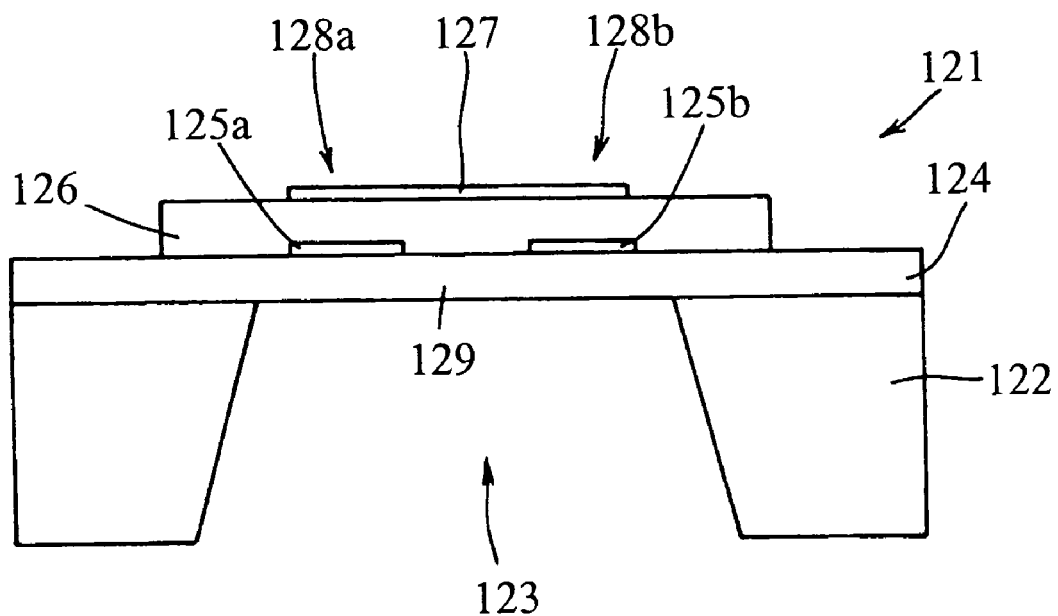
FIG. 35 is a sectional view of the section indicated by a line A-A in FIG. 34 of the piezoelectric filter shown in FIG. 34.
Figure 36:
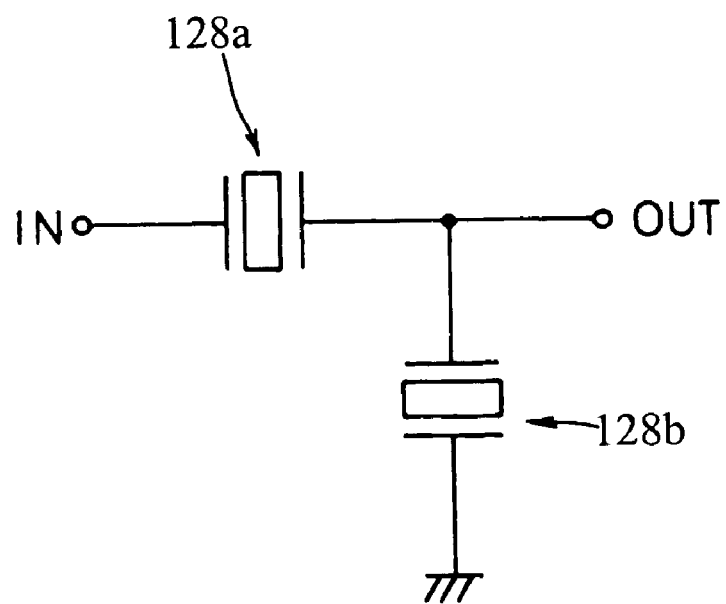
FIG. 36 is a circuit diagram of the piezoelectric filter shown in FIG. 34.

FIG. 34 to FIG. 36 show a piezoelectric filter including the piezoelectric resonator of the second preferred embodiment of the present invention. This piezoelectric filter has a ladder type configuration. FIG. 34 is a schematic plan view showing the piezoelectric filter, FIG. 35 is a sectional view of the section indicated by a line A-A of the piezoelectric filter shown in FIG. 34, and FIG. 36 is a circuit diagram of the piezoelectric filter shown in FIG. 34.

As is clearly shown in FIG. 34 to FIG. 36, a piezoelectric filter 121 defined by a L type ladder filter includes a substrate 122 made of a silicon wafer, an opening 123 arranged in the substrate 122, an insulation film made of silicon oxide (SiO$_2$), lower electrodes 125a and 125b made of aluminum, a piezoelectric thin film 126 primarily containing zinc oxide (ZnO), and an upper electrode 127 made of aluminum. The lower electrode 125a, the upper electrode 127, and the portion of the piezoelectric thin film 126 sandwiched between the two electrodes 125a and 127 define a piezoelectric vibration portion 128a which is a series piezoelectric resonator. The lower electrode 125b, the upper electrode 127, and the portion of the piezoelectric thin film 126 sandwiched between the two electrodes 125b and 127 define a piezoelectric vibration portion 128b which is a parallel piezoelectric resonator. The portion of the insulation film 124 covering the opening 123 defines a diaphragm 129 supporting the piezoelectric vibration portions 128a and 128b such that these piezoelectric vibration portions 128a and 128b can vibrate.

Next, a process for manufacturing the piezoelectric filter 121 will be briefly described step by step.

The substrate 122 made of a silicon wafer is prepared. The insulation film 124 primarily including silicon oxide (SiO$_2$) is formed on the substrate 122 by an RF magnetron sputtering method. Regarding the condition during this film formation, similarly to that in the second preferred embodiment, the gas pressure is within the range of about 0.1 Pa to about 0.25 Pa, and the power density is within the range of about 2.0 (W/cm$^2$) to about 8.5 (W/cm$^2$). A photoresist is patterned on this insulation film 124 by photolithography, and films of the lower electrode 125a and 125b made of aluminum (Al) are formed by evaporation, sputtering, or other suitable method, from above this photoresist. After this film formation, the photoresist is lifted off. The piezoelectric thin film 126 primarily including zinc oxide (ZnO) is formed in a predetermined region on the insulation film 124 and the lower electrodes 125a and 125b by sputtering while masking is performed with a metal mask. A photoresist is patterned on the piezoelectric thin film 126, by photolithography, and a film of the upper electrode 127 made of aluminum (Al) is formed to face a portion of the lower electrodes 125a and 125b in the thickness direction by evaporation, sputtering, or other suitable method, from above this photoresist. Subsequently, films of electrode pads are formed and, thereafter, the photoresist is lifted off. The opening 123 is formed by performing an anisotropic etching treatment on to the back side of the substrate 122. In this case, the opening 123 is formed such that the top surface of the opening 123 extends to the insulation film 124. The primary manufacturing step of the piezoelectric resonator according to preferred embodiments of the present invention is completed through the steps described above.

The surface roughness of the insulation film 124 of the piezoelectric resonator 121 manufactured through the above-described steps is preferably about 0.3 nm on an arithmetic average surface roughness (Ra) basis. The stress in this insulation film 124 of the piezoelectric resonator 121 is a compressive stress of about 150 MPa. When the tensile stress is a positive value, this compressive stress shows a negative value and, therefore, is about −150 MPa.

Figure 37:
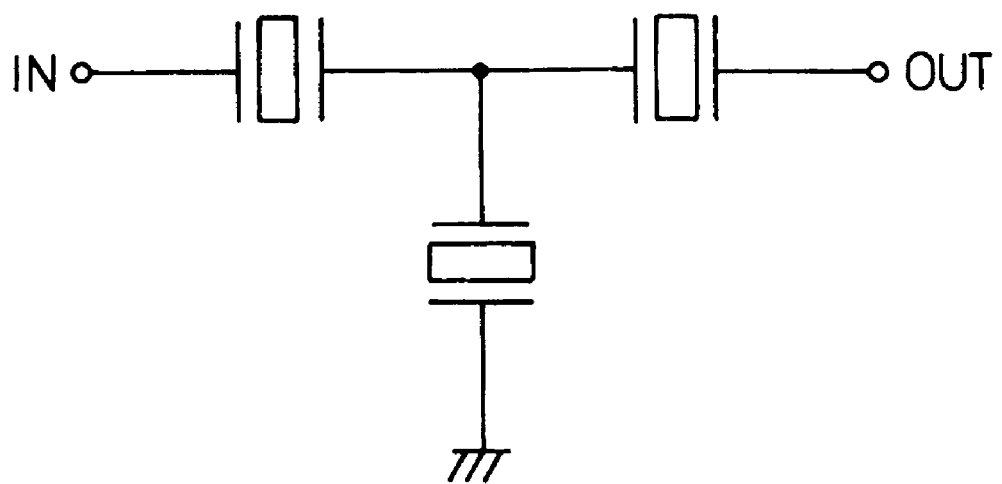
FIG. 37 is a circuit diagram of another piezoelectric filter.
Figure 38:
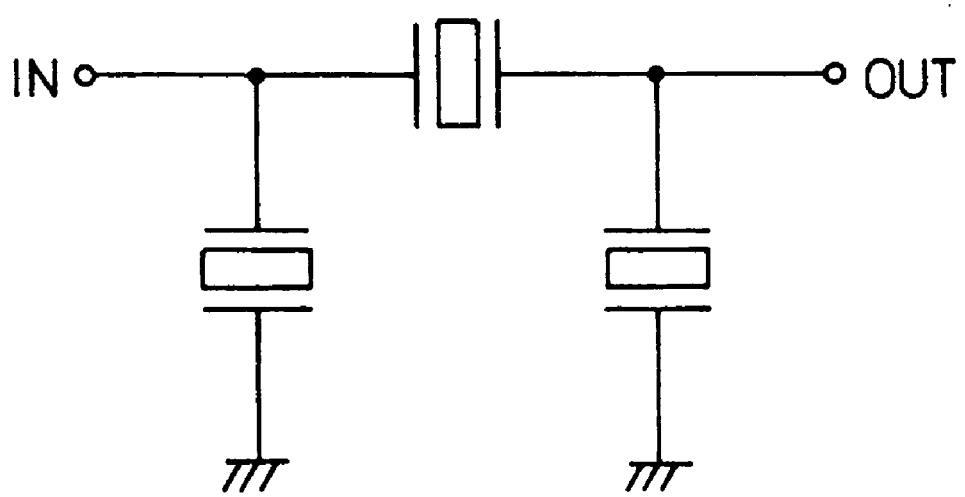
FIG. 38 is a circuit diagram of another piezoelectric filter.

Examples of other ladder type piezoelectric filters include, for example, those shown in FIG. 37 and FIG. 38. The filter shown in FIG. 37 is a T type piezoelectric filter provided with one parallel piezoelectric resonator disposed between two series piezoelectric resonators. Each piezoelectric resonator has an insulation film structure similar to that of the piezoelectric resonator 1 shown in the second preferred embodiment and that of the piezoelectric resonator shown in the fourth preferred embodiment.

The filter shown in FIG. 38 is a π type piezoelectric filter provided with one series piezoelectric resonator disposed between two parallel piezoelectric resonators. Each piezoelectric resonator has an insulation film structure similar to that of the piezoelectric resonator 101 shown in the second preferred embodiment and that of the piezoelectric resonator shown in the fourth preferred embodiment.

Fifth Preferred Embodiment

Figure 39:
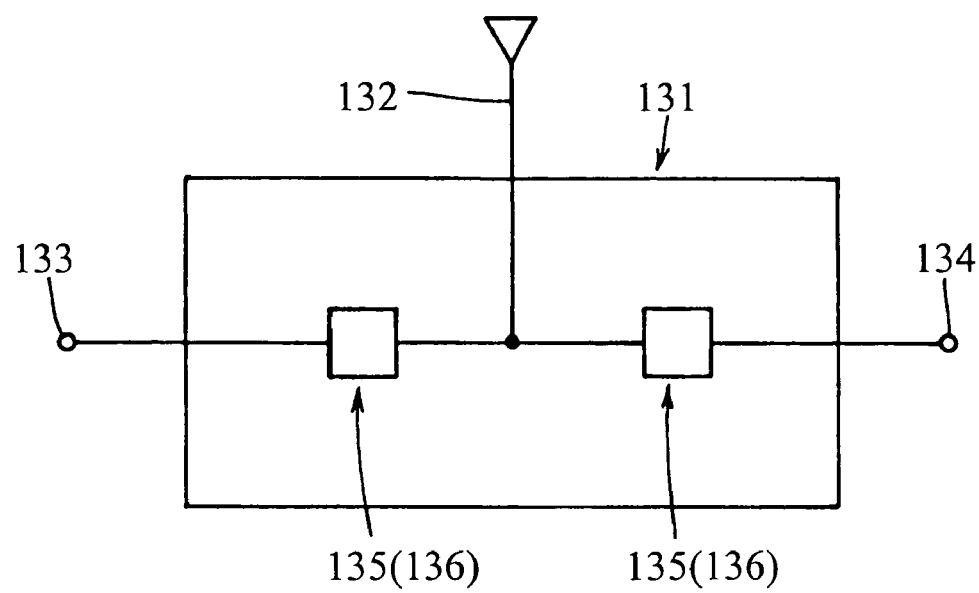
FIG. 39 is a schematic illustrative view showing a duplexer according to a preferred embodiment of the present invention.

FIG. 39 shows a duplexer 131 including the piezoelectric resonator according to a preferred embodiment of the present invention. This duplexer 131 is provided with an antenna terminal 132, receiving side terminal 133, and a sending side terminal 134. This duplexer 131 is configured to include the piezoelectric resonator 135 or piezoelectric filter 136 according to preferred embodiments of the present invention, which permits passage of only high-frequency signals in a required frequency band, between the receiving side terminal 133 and the antenna terminal 132 and between the sending side terminal 134 and the antenna terminal 132.

Sixth Preferred Embodiment

Figure 40:
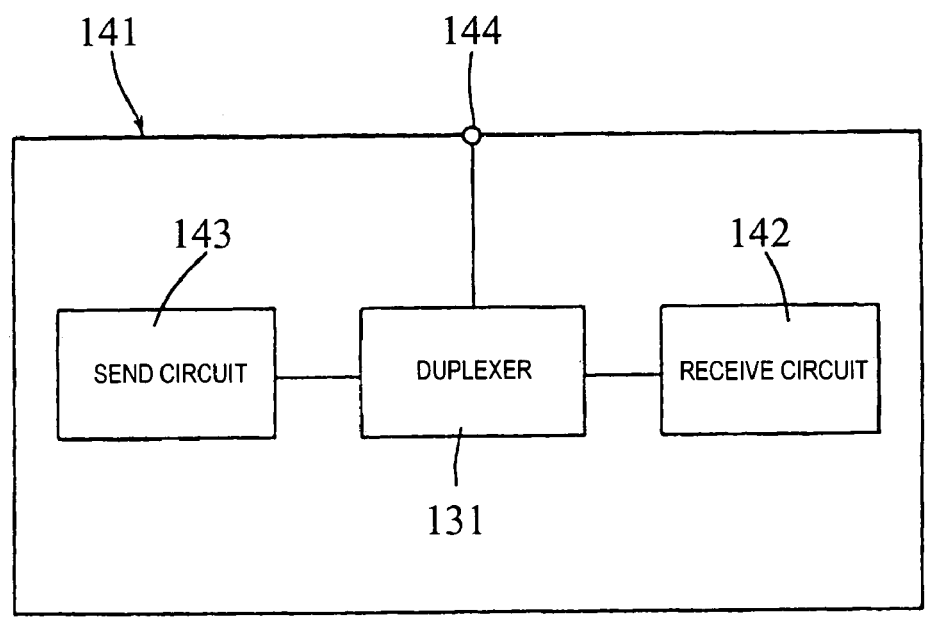
FIG. 40 is a schematic illustrative view showing a communication apparatus according to a preferred embodiment of the present invention.

FIG. 40 shows a communication apparatus 141. This communication apparatus is, for example, a cellular phone.

This communication apparatus is provided with a receive circuit 142 arranged in a main body, a send circuit 143, and an antenna 144. Signals are transmitted between the antenna 144 and the receive circuit 142 and between the antenna 144 and the send circuit 143 through the duplexer 131 as shown in the fifth preferred embodiment. Consequently, by the piezoelectric resonator or piezoelectric filter according to preferred embodiments of the present invention included in this duplexer 131 as a circuit element, the operating characteristics of this communication apparatus 141 are stabilized and, in addition, selecting and switching of the sending signal and receiving signal are efficiently and effectively performed.

The present invention is not limited to that described as the preferred embodiments above, and may be modified examples and application examples, such as described below.

Figure 41:
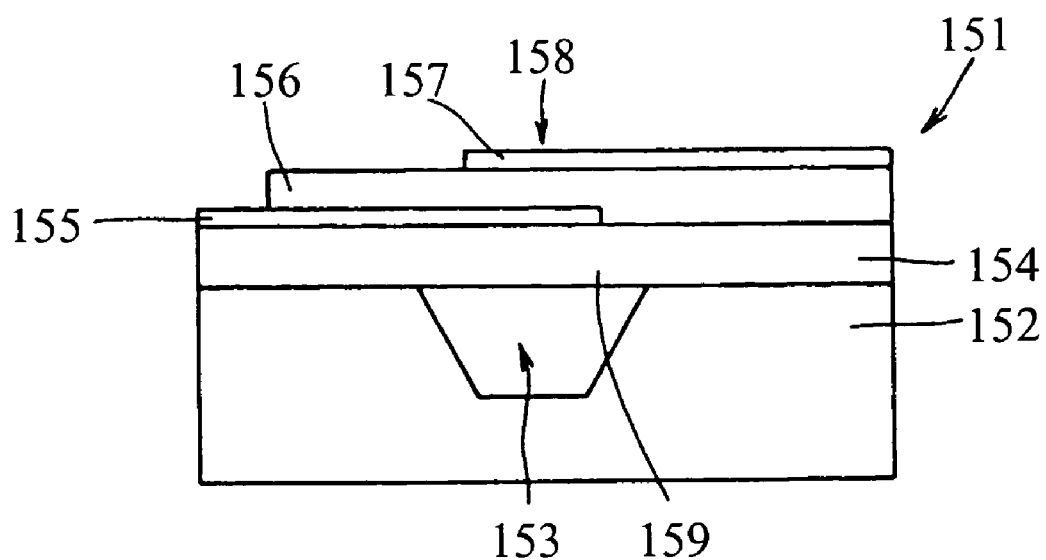
FIG. 41 is a vertical front view showing a modified example of a piezoelectric filter according to preferred embodiments of the present invention.
Figure 42:
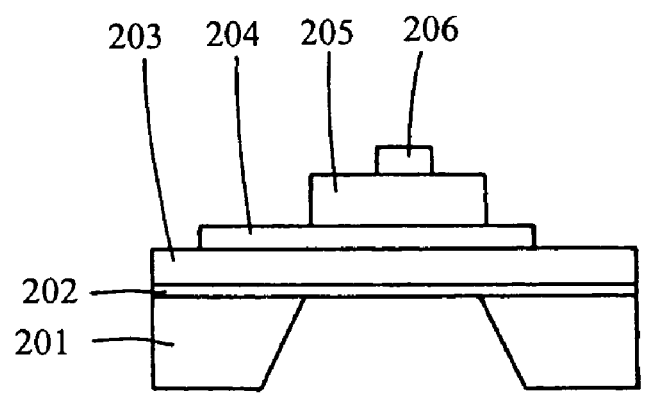
FIG. 42 is a sectional view of a conventional piezoelectric resonator.

FIG. 41 shows a modified example of the piezoelectric resonator. In this piezoelectric resonator 151, a concavity 153 extending downward is arranged on the top surface side of a silicon substrate 152 and, in addition, an insulation film 154 made of silicon oxide ($SiO_2$) is arranged to cover the top surface of the silicon substrate 152 and the concavity 153 thereof. A lower electrode 155 made of aluminum is arranged with a predetermined pattern on this insulation film 154. A piezoelectric thin film 156 made of zinc oxide (ZnO) is arranged on this lower electrode 155 and the insulation film 154. A film of an upper electrode 157 made of aluminum is provided on this piezoelectric thin film 156 and overlaps with the lower electrode 155 in the thickness direction. The lower electrode 155 and the upper electrode 157 facing each other and a portion of the piezoelectric thin film 156 sandwiched by the two electrodes 155 and 157 constitute a piezoelectric vibration portion 158. A portion of the insulation film 154 covering the opening 153 defines a diaphragm 159 supporting this piezoelectric vibration portion 158 such that the piezoelectric vibration portion 158 can vibrate.

The insulation film 154 is made of silicon oxide ($SiO_2$) as a primary component by an RF magnetron sputtering method. Similar to the method for manufacturing the second preferred embodiment, the gas pressure is within the range of about 0.1 Pa to about 0.25 Pa, and the power density is within the range of about 2.0 (W/cm$^2$) to about 8.5 (W/cm$^2$). Accordingly, the surface roughness of the insulation film 154 is about 0.3 nm on an arithmetic average surface roughness (Ra) basis. The stress in this insulation film 154 of the piezoelectric resonator 151 is a compressive stress of about 150 MPa.

The piezoelectric thin film may be composed of aluminum nitride (AlN) as a primary component.

It is essential that the thin film portion sandwiched between the upper electrode and the lower electrode so as to define the vibration portion is composed of at least one layer of piezoelectric thin film, and at least two layers of the piezoelectric thin films may be laminated, or an insulation layer, other than the piezoelectric thin film may be included.

The piezoelectric resonator may be an element vibrates in a thickness shear vibration mode.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method for manufacturing a piezoelectric resonator comprising a substrate, first and second insulation films provided on the substrate, wherein the first and second insulation films and top and bottom surfaces of a thin film portion including at least one layer of piezoelectric thin film are sandwiched between at least a pair of upper and lower electrodes which face each other in the thickness direction of the thin film, the method comprising the step of:

forming an insulation film primarily including $Al_2O_3$ by an electron beam evaporation method at a film thickness growth rate of about 0.6 nm/sec to about 1.0 nm/sec, wherein the insulation film primarily including $Al_2O_3$ is an upper layer of the first and second insulation films.

2. A method for manufacturing a piezoelectric resonator comprising a substrate, an insulation film provided on the substrate, and a vibration portion provided on the insulation film, the vibration portion including a thin film portion having top and bottom surfaces of including at least one layer of piezoelectric thin film sandwiched between at least a pair of upper and lower electrodes facing each other in the thickness direction, the method comprising:

a first step of forming the insulation film from alluminum oxide as a primary component by an electron beam evaporation method at a film thickness growth rate within the range of about 0.6 nm/sec to about 1.0 nm/sec; and a second step of forming the piezoelectric thin film from zinc oxide as a primary component.

* * * * *